US005252142A

United States Patent [19]
Matsuyama et al.

[11] Patent Number: 5,252,142
[45] Date of Patent: Oct. 12, 1993

[54] PIN JUNCTION PHOTOVOLTAIC ELEMENT HAVING AN I-TYPE SEMICONDUCTOR LAYER WITH A PLURALITY OF REGIONS HAVING DIFFERENT GRADED BAND GAPS

[75] Inventors: Jinsho Matsuyama; Tsutomu Murakami; Koichi Matsuda; Hiroshi Yamamoto; Toshihiro Yamashita, all of Nagahama, Japan

[73] Assignee: Canon Kabushiki Kaisha, Tokyo, Japan

[21] Appl. No.: 796,394

[22] Filed: Nov. 22, 1991

[30] Foreign Application Priority Data

Nov. 22, 1990 [JP] Japan .................. 2-315924

[51] Int. Cl.[5] .......................... H01L 31/075
[52] U.S. Cl. ..................... 136/255; 136/249; 136/258; 257/55; 257/458
[58] Field of Search .......... 136/255, 258 AM, 249 TJ; 357/30 J, 30 K, 30 N, 58, 88; 257/55, 458

[56] References Cited

U.S. PATENT DOCUMENTS 4,542,256  9/1985  Wiedeman ................ 136/249
4,816,082  3/1989  Guha et al. ............... 136/249
5,104,455  4/1992  Yokota et al. .......... 136/249 TJ

OTHER PUBLICATIONS

*Solar Cells*, Jun.-Jul. 1983, vol. 9, No. 1-2, Carlson, D. E. et al., "Light-Induced Effects In Amorphour Silicon Material and Devices," pp. 19-23.
*Journal of Applied Physics*, Jul. 15, 1985, vol. 58, No. 2, Hack, M. et al. "Physics of Amorphous Silicon Alloy p-in-n Solar Cells", pp. 997-1020.

*Primary Examiner*—Aaron Weisstuch
*Attorney, Agent, or Firm*—Fitzpatrick, Cella, Harper & Scinto

[57] ABSTRACT

A pin junction photovoltaic element having an i-type semiconductor layer formed of a variable band gap semiconductor material, said i-type semiconductor layer being positioned between a p-type semiconductor layer having a band gap wider than that of said i-type semiconductor layer and an n-type semiconductor layer having a band gap wider than that of said i-type semiconductor layer, characterized in that said i-type semiconductor layer contains a first region (a) which is positioned on the side of said p-type semiconductor layer and also has a graded band gap, a second region (b) which is adjacent to said first region (a) and has a graded band gap, and a third region (c) which is positioned on the side of said n-type semiconductor layer and also has a graded band gap; said i-type semiconductor layer having a minimum band gap at the boundary between said first region (a) and said second region (b); the thickness of said first region (a) being less than one-half of the total thickness of said i-type semiconductor layer; and the gradient of the band gap of said third region (c) being greater than that of the band gap of said second region (b).

8 Claims, 13 Drawing Sheets

PIN JUNCTION PHOTOVOLTAIC ELEMENT HAVING AN I-TYPE SEMICONDUCTOR LAYER WITH A PLURALITY OF REGIONS HAVING DIFFERENT GRADED BAND GAPS

BACKGROUND OF THE INVENTION

1. Field of the Invention

The present invention relates to an improved pin junction photovoltaic element which exhibits an improved photoelectric conversion efficiency and which can be provided at a reduced cost. More particularly, the present invention relates to an improved pin junction photovoltaic element provided with a specific i-type semiconductor layer with a plurality of regions having different graded band gaps which exhibits an improved photoelectric conversion efficiency and which can be provided at a reduced cost.

2. Related Background Art

In recent years, there has been an increased societal demand for early realization of a power generation system capable of providing clean energy without causing $CO_2$ buildup as in the case of thermal power generation.

There have been made various proposals which are expected to meet such societal demand. Of those proposals, solar cells are expected to be a future power generation source since they supply electric power without causing the problem above mentioned.

There are a number of solar cells which have been put into practical use. Among those solar cells, there is a solar cell made of a single crystal silicon material (which is commonly called the "single crystal silicon solar cell"). This single crystal silicon solar cell has been found to be highly reliable and high in photoelectric conversion efficiency. This single crystal silicon solar cell is produced in a manner similar to the semiconductor wafer process of producing an integrated circuit. That is, a single crystal silicon ingot containing a minute amount of a dopant (i.e. a valence electron controlling agent) of p-type or n-type is first prepared by a crystal growth method, a silicon wafer is cut from the ingot, and a p-n junction is formed in the silicon wafer thus obtained by diffusing a different dopant therein. In the single crystal silicon solar cell, light such as sunlight is absorbed, the absorbed light generates excited photocarriers and those photocarriers migrate under the action of an internal electric field of the p-n junction, whereby a photoelectromotive force is generated. However, the single crystal silicon solar cell is costly since it is produced by a semiconductor wafer process as above mentioned. In addition to this, there is a disadvantage in the single crystal silicon solar cell in that there is a limit to the area of a silicon wafer that can be produced because of the requirement for growing a single crystal and it is therefore extremely difficult to make it in a large area. Further, in order for the single crystal silicon solar cell to be employed in a module usable as a power source outdoors, it is necessary to provide the cell with protective equipment. In consequence, the resulting single crystal silicon solar cell module unavoidably becomes relatively costly in comparison with oil fired power generation in terms of production cost of a unit of electricity.

In any case, in order to make solar cells usable as practical power sources, it is an essential that a large area solar cell be industrially mass-produced at a reduced cost. This requirement is not met by the above single crystal silicon solar cell.

Thus, various studies have been made on the constituent semiconductor films from various viewpoints such as reproducibility, productivity, production cost, etc.

So far there have been proposed various non-single crystal semiconductor films such as tetrahedral non-single crystal semiconductor films of amorphous silicon (a-Si), amorphous silicon germanium (a-SiGe), amorphous silicon carbide (a-SiC), etc., compound semiconductor films containing elements of groups II and VI of the periodic table such as CdS, CdTe, $Cu_2S$, ZnSe and ZnTe semiconductor films, and other compound semiconductor films containing elements of groups I, III, and VI of the periodic table.

Among these semiconductor films, the tetrahedral non-single crystal semiconductor films (that is, amorphous silicon semiconductor films) are expected to be the most promising in view of their various advantages, such as, for example, that a large semiconductor film capable of being the constituent of a solar cell can be relatively easily formed, that this semiconductor film can be thinned as desired and formed on a selected substrate, and that a large area solar cell can be produced on an industrial scale, and thus it is possible to provide a solar cell at reasonable cost.

Now, as such a solar cell, there have been proposed a number of solar cells in which non-single crystal semiconductor films (amorphous semiconductor films) are used (these solar cells will be hereinafter referred to as non-single crystal solar cells or amorphous solar cells). Non-single crystal solar cells which are presently known are typically pin junction type, MIS type (comprising metal layer/insulating layer/semiconductor layer) or heterojunction type. Of these, solar cells of pin junction type (hereinafter referred to as "pin junction solar cells" or "pin junction photovoltaic elements") are of greatest interest. The pin junction solar cell typically comprises a metallic electrode layer, a photoelectromotive force generating layer and another electrode disposed in this order on a substrate, in which said photoelectromotive force generating layer comprises a multi-layered body comprising an n-type semiconductor layer, an i-type semiconductor layer, and a p-type semiconductor layer.

There is, however, a disadvantage of such a non-single crystal solar cell in that its photoelectric conversion efficiency is inferior to that of the foregoing single crystal solar cell. In view of this, various studies have been made in order to improve the photoelectric conversion efficiency of such a non-single crystal solar cell.

Particularly, for amorphous silicon (a-Si) which is the amorphous semiconductor most widely used at the present time, its energy band width is about 1.7 eV or more, and because of this, light of 750 nm or more in wavelength is barely absorbed by the amorphous silicon.

Therefore, long wavelength energy components of the sunlight spectrum are not efficiently utilized.

In order to eliminate this problem, studies have been made on other silicon-containing amorphous materials comprising a-Si incorporating appropriate atoms such as germanium atoms (Ge), tin atoms (Sn) or lead atoms (Pb) which have a band gap narrower than that of a-Si (amorphous silicon). As for these silicon-containing amorphous materials, there is an advantage that their band gap can be properly adjusted by controlling the amount of such atoms incorporated thereinto.

There has been proposed a pin junction solar cell (which is a so-called single cell type pin junction solar cell) in which such narrow band gap silicon-containing amorphous material is used as the i-type semiconductor layer. Further, there has been proposed a multicell-stacked solar cell comprising a pin junction solar cell element having an i-type semiconductor layer formed of such narrow band gap silicon-containing amorphous material and another pin junction solar cell element having an i-type semiconductor layer formed of a-Si. It is generally believed that the latter multicells-stacked solar cell provides a photoelectric conversion efficiency greater than that provided by the former single cell type solar cell.

However, there are disadvantages for the foregoing silicon-containing amorphous materials in that they are inferior to a-Si in terms of the combined states of the atoms; films of them are liable to easily deteriorate in comparison with the a-Si; and they are also inferior to the a-Si in terms of the product $\mu\tau$ of an electron and a hole (that is the product of a carrier's mobility and a carrier's mean life time).

Now, U.S. Pat. No. 4,816,082 (hereinafter referred to as "Literature 1") proposes a pin junction solar cell having an i-type semiconductor layer comprising an amorphous alloy in which the band gap of the i-type semiconductor layer is graded such that the band gap of each of the regions in contact with the p-type semiconductor layer and the n-type semiconductor layer is widened and is a minimum at a central region. This proposed pin junction solar cell aims at providing an improved photoelectric conversion efficiency by varying the band gap of the i-type semiconductor layer depending on the position thereof n the thickness direction.

Besides the above proposal, U.S. Pat. No. 4,542,256 (hereinafter referred to as "Literature 2") proposes a pin junction photovoltaic cell (namely, pin junction solar cell) which is aimed at providing an improved photoelectric conversion efficiency by forming the n-type semiconductor layer or the p-type semiconductor layer of a material having a band gap wider than that of the constituent material of the i-type semiconductor layer and disposing a layer (that is a so-called intermediate layer) having a continuously graded band gap not only at the interface between the p-type semiconductor layer and the i-type semiconductor layer but also at the interface between the n-type semiconductor layer and the i-type semiconductor layer.

However, neither of these proposals is sufficient in terms of providing high enough photoelectric conversion efficiency in a pin junction solar cell.

SUMMARY OF THE INVENTION

The principal object of the present invention is to provide an improved photovoltaic element which exhibits a fill factor higher than that of the known photovoltaic element and provides a satisfactory photovoltaic conversion efficiency.

Another object of the present invention is to provide an improved photovoltaic element having an i-type semiconductor layer formed of a band gap variable semiconductor material between a p-type semiconductor layer having a band gap wider than that of said i-type semiconductor layer and an n-type semiconductor layer having a band gap wider than that of said i-type semiconductor layer, wherein the said i-type semiconductor layer contains (a) a first region which is positioned on the side of said p-type semiconductor layer and has a graded band gap, (b) a, second region which is adjacent to said first region (a), and (c) a third region which is positioned on the side of said n-type semiconductor layer and has a graded band gap; said i-type semiconductor layer has a minimum band gap at the boundary between said first region (a) and said second region (b); the thickness of said first region (a) is less than one half of the thickness of said i-type semiconductor layer; and the gradient of the graded band gap of said third region (c) is larger than that of the band gap of said second region (b).

The pin junction photovoltaic element of the present invention is clearly distinguished from the photovoltaic element disclosed in Literature 1. That is, in the pin junction photovoltaic element disclosed in Literature 1, the gradient of the band gap between its minimum point and its maximum point in the i-type semiconductor layer is linear, that is, uniform. On the other hand, in the pin junction of the present invention, the band gap in the i-type semiconductor layer is made such that it is gradually graded from the center towards the p-type semiconductor layer to a minimum at a given position on the side of the p-type semiconductor layer; it is maximum at the interface with the n-type semiconductor layer and also at the interface with the p-type semiconductor layer; and the gradient of the band gap extending from the minimum point to the maximum point is relatively gentle in the region on the side of the minimum point but relatively steep in the region on the side of n-type semiconductor layer. Because of this unique band gap construction, the pin junction photovoltaic element provides an improved photoelectric conversion efficiency which cannot be attained by the photovoltaic element of Literature 1.

In the case of a pin junction photovoltaic element (that is pin junction solar cell), it is generally considered that the internal electric field of the i-type semiconductor layer which is provided by the pin junction is intense at the interface with the p-type semiconductor layer and at the interface with the n-type semiconductor layer and it is weak in the interior of the i-type semiconductor layer. It is also considered that in any case where light is impinged from the side of the p-type semiconductor layer or from the side of the n-type semiconductor layer, the electric field is weakened most in a region of the i-type semiconductor layer situated near the n-type semiconductor layer. This situation is apparent with reference to the report by D. E. Carlson under the title "Light-induced effect in amorphous silicon material and devices" in *Solar Cells*, Vol. 9, pp. 19–20 (1983) and also the report by M. Hack et al in *J. App. Phys.* Vol. 58, pp. after 997 (1985).

The present inventors have made various studies of the properties of the pin junction solar cell as above described. As a result, the following knowledge was obtained. That is, (i) it is possible to promote the transportation of minority carriers by enlarging the gradient of the band gap of the region of the i-type semiconductor layer where the internal electric field is the most weakened, that is, the region of the i-type semiconductor layer which is situated near the n-type semiconductor layer either in a pin junction solar cell of the type wherein light is incident on the side of the p-type semiconductor layer or in a pin junction solar cell of the type wherein light is incident on the side of the n-type semiconductor layer; (ii) it is possible to enlarge the gradient of the end portion of a valence electron band extending from near the point where the internal electric field is the most weakened towards the n-type semiconductor layer by relatively enlarging the gradient of the region (wherein the minority carriers are holes) of the i-type semiconductor layer near the interface with the n-type semiconductor layer and relatively minimizing the gradient of the region situated in the interior of the i-type semiconductor layer (near the minimum point of the band gap); and by combination of the said (i) and (ii), the transportation of holes can be promoted. The present inventors obtained further knowledge that in the case of a pin junction solar cell, when the minimum point of the band gap in the i-type semiconductor layer is situated at a position closer to the p-type semiconductor layer than to the center thereof, light absorption in the neighborhood of the interface with the p-type semiconductor layer is improved, thereby increasing generation of photocarriers and shortening the transport distance of generated holes and that because of this, the efficiency of collecting photocarriers is improved.

According to the technique disclosed in Literature 1, it is possible to improve the open circuit voltage (Voc) and the fill factor (F.F.) of a pin junction solar cell in comparison with the case of a pin junction photovoltaic element (that is, pin junction solar cell) of Literature 2 which has an i-type semiconductor layer not having a graded band gap. However, in the case of the pin junction photovoltaic element of the present invention, because the mean value of the band gaps of the i-type semiconductor layer is smaller than that in the pin junction solar cell which has a linear gradient of the band gap in the i-type semiconductor layer, absorption of long wavelength light is improved, resulting in an increase in the short circuit current (Isc). Further in the case of the pin junction photovoltaic element of the present invention, it is possible to reduce the thickness of a semiconductor film required to provide a short circuit current equivalent to the short circuit current obtained in the pin junction solar cell of Literature 1, in which the gradient of the band gap in the i-type semiconductor layer is linear, and because of this, the fill factor of the pin junction photovoltaic element of the present invention is improved.

Herein, the fill factor means a value obtained by dividing the maximum power which can be generated under predetermined light irradiation by the product of the open circuit voltage and the short circuit current at that time, and it is believed that the closer the value is to 100%, the better the solar cell.

As above described, the photovoltaic element of the present invention excels in short circuit current and in fill factor and provides an improved photoelectric conversion efficiency.

DETAILED DESCRIPTION OF THE PREFERRED EMBODIMENTS

The present invention will be described in detail in the following.

Figure 1:
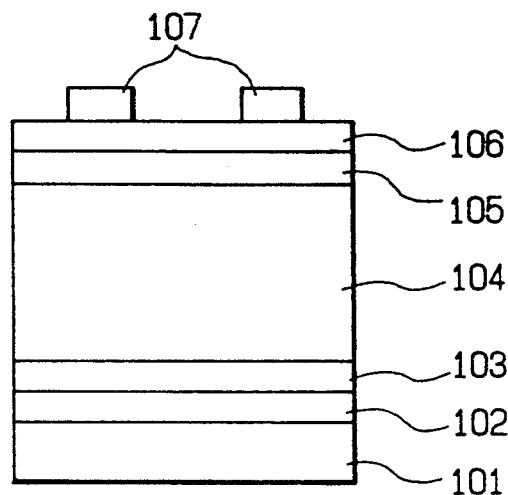
FIG. 1 is a schematic cross section view illustrating the constitution of a typical pin junction photovoltaic element of the present invention.

FIG. 1 is a schematic cross section view illustrating the constitution of a typical pin junction solar cell as an example of the pin junction photovoltaic element of the present invention.

The pin junction solar cell shown in FIG. 1 comprises a lower electrode 102, an n-type semiconductor layer 103, an i-type semiconductor layer 104, a p-type semiconductor layer 105, and a transparent electrode 106 being laminated in this order on a substrate 101. Reference number 107 stands for a collecting electrode disposed on the transparent electrode 106. This pin junction solar cell is of the type wherein light is incident on the side of the p-type semiconductor layer 105. Each of the lower electrode 102 and the transparent electrode 106 serves as a means to output photocurrent from the pin junction structure. In the pin junction solar cell shown in FIG. 1, the lower electrode 102 is connected to the n-type semiconductor layer 103 through an ohmic contact, and likewise, the transparent electrode 106 is contacted to the p-type semiconductor layer 105 through an ohmic contact.

In the following, explanation will be made of each of the constituents of the above pin junction solar cell.

Substrate

The substrate 101 may be electroconductive or electrically insulating, and it may be transparent or opaque. The electroconductive substrate can include, for example, metals such as Al, Fe, Cu, Ni, and Ag and alloys of these metals such as stainless steel. In the case where the substrate 101 comprises an electroconductive member selected from the group consisting of the above metals and alloys, the substrate may serve also as the lower electrode 102. In this case, the substrate may also serve as a current-outputting electrode (not shown in the figure).

The electrically insulating substrate can include, for example, films or sheets of inorganic materials such as alkali-free glass, $SiO_2$, $Si_3N_4$, $Al_2O_3$, and the like or synthetic resins such as polyimide, polyamide, polyester, polyethylene, polyethylene terephthalate, cellulose acetate, polypropylene, polyvinyl chloride, polystyrene, epoxy resin, and the like.

The electroconductive substrate may comprise a member made of such metal or alloy as above mentioned, coated with any of the foregoing synthetic resins on the rear face thereof.

In the case where the substrate 101 comprises such electrically insulating film or sheet as above mentioned, it is desired to form an electroconductive thin film of a metal, e.g. Al, Ag, Pt, Au, Ni, Ti, Mo, W, Fe, V; Cr or Cu, an alloy, e.g. stainless steel, brass, or nichrome, or a transparent and conductive oxide (TCO) material, e.g. $SnO_2$, $In_2O_3$, or ITO ($In_2O_3 + SnO_2$) on the surface of the electrically insulating substrate on which a deposited film (the lower electrode 102 or a semiconductor layer) is to be disposed by metal plating, vacuum deposition or sputtering. In this case, the electroconductive film formed on the surface of the electrically insulating substrate may function as the foregoing current outputting electrode.

The substrate 101, even if it is composed of an electroconductive material, may be provided with a metallic layer comprising a metal different from the constituent metal of the substrate on the surface thereof on which a deposited film is to be formed, in order to improve the long wavelength reflection coefficient at the surface of the substrate and also in order to prevent occurrence of mutual interdiffusion of the constituent materials between the substrate 101 and the deposited film formed on the surface thereof.

In the case of a pin junction solar cell of the type in which light is impinged from the side of the substrate, it is desired that the substrate be constituted by a relatively transparent and conductive material, e.g. by forming a thin film of a transparent and conductive oxide or a metal having a thickness capable of allowing light transmission therethrough on the surface thereof. A pin junction solar cell of the type in which light is impinged from the side of the substrate will be later described.

It is possible for the surface of the substrate to be flat or uneven, wherein the surface is provided with minute irregularities. In the case where the substrate surface is provided with minute irregularities, the irregularities may be of spherical, conical, or pyramid shape in which the maximum height is preferably 500 Å to 5000 Å. There is an advantage in this case that light is irregularly reflected at the uneven surface of the substrate, thereby increasing the optical path length of the light thus reflected.

Electrodes

In the pin junction solar cell of the present invention, appropriate electrodes are used in accordance with the configuration of the cell. As such electrodes, there can be mentioned the lower electrode, transparent electrode (upper electrode), and collecting electrode. The upper electrode denotes the one on the side from which light is impinged, and the lower electrode denotes the one placed opposite the upper electrode, with the semiconductor layers being arranged between the two electrodes.

These electrodes will be described in the following.

Lower Electrode

The lower electrode 102 is disposed between the substrate 101 and the n-type semiconductor layer 103 as above described. In the case where the substrate 101 is electroconductive, the substrate can function also as the lower electrode 102. However, in the case where the substrate is electroconductive but is of a high sheet resistance, the lower electrode 102 may be disposed as a lower resistance electrode serving to output current or in order to increase the reflectivity of the incident light at the surface of the substrate so as to make it utilized more efficiently. In the case where the substrate 101 comprises an electrically insulating member, it is essential to provide the lower electrode 102 in order to output the current, and the lower electrode is placed between the electrically insulating substrate 101 and the semiconductor layer 103.

The lower electrode 102 may comprised of a thin film of a member selected from the group consisting of Ag, Au, Pt, Ni, Cr, Cu, Al, Ti, Zn, Mo, W, and alloys of these metals. The thin film may be formed by way of known vacuum deposition, electron-beam, or sputtering techniques.

However, due care should be taken so that the metallic thin film thus formed is not a resistive component of the pin junction solar cell. In view of this, the metallic thin film consisting the lower electrode 102 should be of a sheet resistance preferably of 50Ω or less, more preferably 10Ω or less.

Alternatively, it is possible to dispose a diffusion preventive layer composed of an electroconductive material such as zinc oxide between the lower electrode 102 and the n-type semiconductor layer 103. (This is not shown in the figure). When a diffusion preventive layer is employed in this way, there are provided such advantages that it prevents the metal elements constituting the lower electrode 102 from diffusing into the n-type semiconductor layer; it serves to cause multiple interference effects with the thin film and confine the incident light within the semiconductor layer; and being provided with a certain resistance value, it prevents occurrence of short circuit, which would otherwise occur between the lower electrode 102 and the transparent electrode 106 through the semiconductor layers arranged between them due to pinholes and the like.

Transparent electrode (upper electrode)

The transparent electrode 106 is desired to have a light transmittance of more than 85% so that it allows the semiconductor layer to efficiently absorb sunlight or fluorescent light. In addition to this, it is desired to have a sheet resistance of 100Ω or less from the viewpoint of preventing the internal resistance of the pin junction solar cell from becoming great, thereby reducing the performance.

In view of the above, the transparent electrode 106 is desired to comprise a thin film of a metal oxide selected from the group consisting of $SnO_2$, $In_2O_3$, ZnO, CdO, $Cd_2SnO_4$, and ITO ($In_2O_3 + SnO_2$) or a semitransparent thin film of a metal selected from the group consisting of Au, Al, and Cu.

The transparent electrode 106 is disposed on the p-type semiconductor layer 105. Therefore, it is necessary to constitute the transparent electrode 106 with a thin film member selected from the foregoing which is good in adhesion at least with the p-type semiconductor layer 105.

The transparent electrode 106 comprising such thin film may be formed by way of resistance heating, electron beam, sputtering, or spraying techniques.

Collecting electrode

The collecting electrode 107 is disposed on the transparent electrode 106 for the purpose of reducing the surface resistance of the transparent electrode.

The collecting electrode 107 is desired to comprise a thin film of a member selected from the group consisting of Ag, Cr, Ni, Al, Au, Ti, Pt, Cu, Mo, and alloys of these metals. It is possible for the collecting electrode to be constituted by a member comprising a plurality of such metallic thin films in laminated form.

The shape and the area of the collecting electrode 107 should be properly designed so that a sufficient quantity of light can be received by the semiconductor layer. Specifically as for the shape, it is desired that it extend uniformly all over the light receiving face of the pin junction solar cell. As for the area, it is desired that it cover 15% or less of said light receiving face in a preferred embodiment or 10% or less in a more preferred embodiment.

The member constituting the collecting electrode 107 is of a sheet resistance preferably 50Ω or less, more preferably 10Ω or less.

In the following, explanation will be given of each of the constituent semiconductor layers.

i-Type Semiconductor Layer

The i-type semiconductor layer 104 is constituted by a material capable of being band gap adjusted.

Specific examples of such material can include silicon-containing amorphous materials such as a-Si, a-SiGe, a-SiSn, a-SiPb, etc., microcrystal Si, polycrystal Si, compounds containing elements belonging to group II and group VI of the periodic table (hereinafter referred to as "group II-VI compounds"), such as CdS, CdTe, etc., and compounds containing elements belonging to group III and group V of the periodic table (hereinafter referred to as "group III-V compounds") such as GaAs, InSb, etc.

The thickness of the i-type semiconductor layer varies depending upon the kind of material of which the layer is constituted. For instance, when it is constituted of a-Si, the thickness is desired to be 500 to 8000 Å. Likewise, when it is constituted by another silicon-containing amorphous material such as a-SiGe, the thickness is desired to be 1000 to 5000 Å.

Explanation will be now given of the band gap in the i-type semiconductor layer 104.

The band gap in the i-type semiconductor layer 104 is graded depending upon given positions in the thickness direction and becomes a minimum at a given point in the thickness direction (this point will be hereinafter simply called "minimum point"). Particularly, the band gap becomes gradually widened as the distance from the minimum point to the interface between the i-type semiconductor layer 104 and the n-type semiconductor layer 103 decreases. The i-type semiconductor layer 104 is desired to be smoothly joined with the n-type semiconductor layer 103 such that there is no band gap discontinuity at the interface between the two layers. The band gap extending from the minimum point towards the n-type semiconductor layer is made such that its gradient is relatively gentle in the region situated at the side of the minimum point and is relatively steep in the region situated at the side of the n-type semiconductor layer 103.

In relation to the p-type semiconductor layer 105, the band gap becomes gradually widened as the distance from the minimum point to the interface between the i-type semiconductor layer 104 and the p-type semiconductor layer 105 decreases. Also, the i-type semiconductor layer 104 is desired to be smoothly joined with the p-type semiconductor layer 104 such that there is no band gap discontinuity at the interface between the two layers.

The optimum position of the minimum point in the i-type semiconductor layer varies, depending upon the kind of material used and the constitution of the pin junction solar cell, but in general, it is desired to be designed such that it be situated in the region near the p-type semiconductor layer in terms of the thickness direction of the i-type semiconductor layer 104. In a preferred embodiment, the minimum point is situated in the region between the interface with the p-type semiconductor layer 105 and a position corresponding to one third of the entire thickness of the i-type semiconductor layer 104. In a more preferred embodiment, the minimum point is situated in the region between the interface with the p-type semiconductor layer 105 and a position corresponding to one fourth of the entire thickness of the i-type semiconductor layer 104.

More detailed explanation will be made of the shape of the band gap in the i-type semiconductor layer with reference to the drawings.

Figure 2:
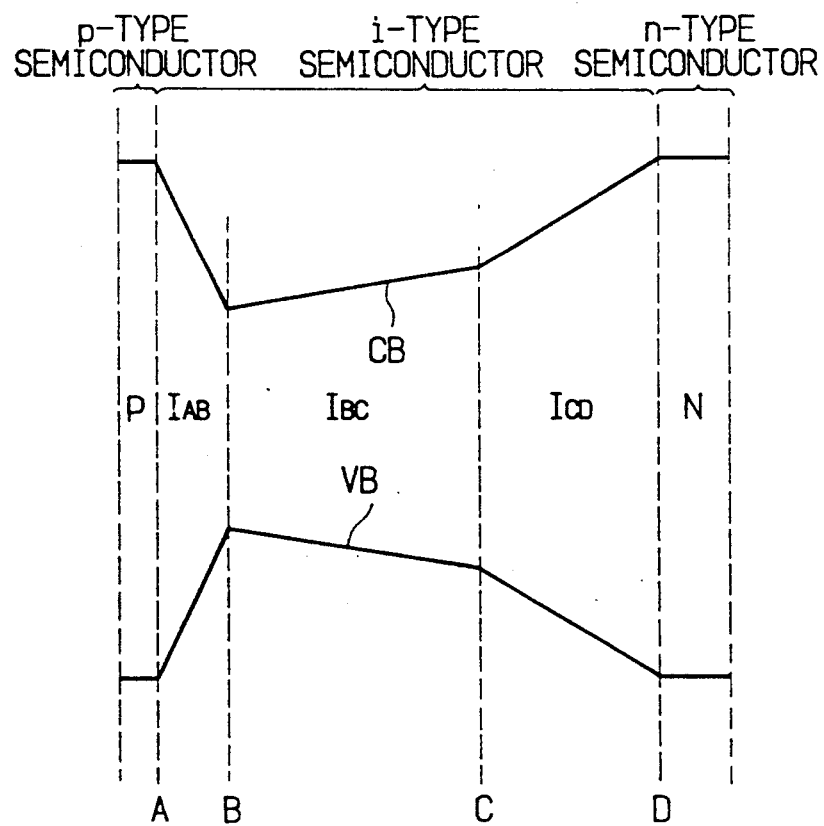
FIG. 2 is a schematic diagram illustrating the profile of the energy band gap in a pin junction photovoltaic element of the present invention.

FIG. 2 is a schematic diagram illustrating the profile of the energy band gap of the semiconductor layer of a pin junction solar cell according to the present invention.

In the figure, CB denotes the lower edge of the conduction band and VB denotes the upper edge of the valence electron band.

Suppose light is impinged from the side of the p-type semiconductor layer. As is apparent from FIG. 2, by minimizing the thickness of a region $I_{AB}$ to less than ½ of the thickness of the i-type semiconductor layer, the band gap is made minimum (that is, the minimum point) at a position (position B) which is situated near the p-type semiconductor layer in the region of the i-type semiconductor layer, between the center of the i-type semiconductor layer and its interface A with the p-type semiconductor layer. The characteristics of the i-type semiconductor layer containing region $I_{AB}$, region $I_{BC}$ and region $I_{CD}$ are adjusted so that the band gap is maximum at the interface A between the i-type semiconductor layer and the p-type semiconductor layer and at the interface D between the i-type semiconductor layer and the n-type semiconductor layer and in addition, the gradient of the band gap between the minimum point B and the maximum point D on the side of the n-type semiconductor layer is relatively gentle in the region $I_{BC}$ near the minimum point B and relatively steep in the region $I_{CD}$ near the point D.

In the case of FIG. 2, the band gap is linearly graded in the region $I_{BC}$, the gradient thereof is then changed at the point C, and it is again linearly graded in the region $I_{CD}$, wherein the gradient of the band gap in the region $I_{BC}$ is smaller than that in the region $I_{CD}$.

Figure 3:
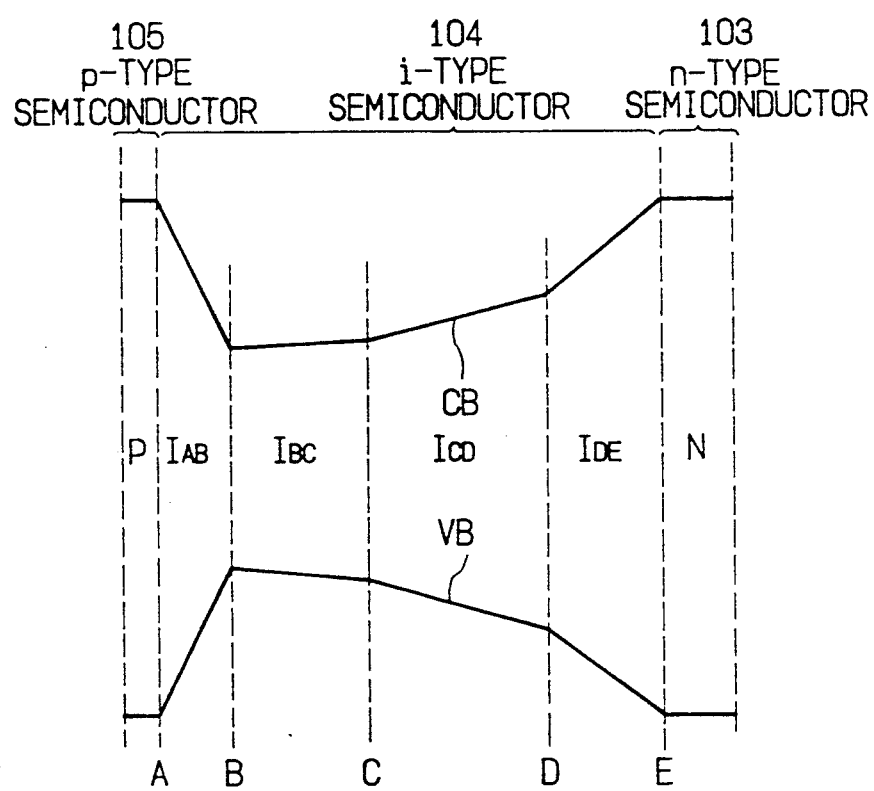
FIG. 3 is a schematic diagram illustrating the profile of the energy band gap in another pin junction photovoltaic element of the present invention.

Alternatively, as shown in FIG. 3, it is possible that the region between the minimum point (B) of the band gap and the interface (E) with the n-type semiconductor layer is divided into three regions ($I_{BC}$, $I_{CD}$, and $I_{DE}$) and the gradient of the band gap is made different in each of these three regions. In this case, there are established two turning points (C, D) with respect to the gradient of the band gap, wherein the gradient of the band gap is step-wise increased from the minimum point towards the interface with the n-type semiconductor layer.

FIG. 3 is a schematic diagram illustrating the profile of the energy band gap of the semiconductor layer of a pin junction solar cell according to the present invention wherein, as above described, the i-type semiconductor region situated between the minimum point B of the band gap and the interface E with the n-type semiconductor layer is divided into three regions $I_{BC}$, $I_{CD}$, and $I_{DE}$.

In the case of FIG. 3, the gradient of the band gap width in the region $I_{CD}$ is greater than that in the region $I_{BC}$, and the gradient of the band gap width in the region $I_{DE}$ is greater than that in the region $I_{CD}$.

In this case, the thickness of the region $I_{DE}$ is preferably 510 Å or more, more preferably 550 Å or more.

In the following, explanation will be given of a pin junction solar cell as a further example according to the present invention in which the i-type semiconductor layer region situated between the minimum point of the band gap and the interface with the n-type semiconductor layer is divided into mathematically infinitely small regions and the gradient of the band gap in each of the regions is changed.

Figure 4:
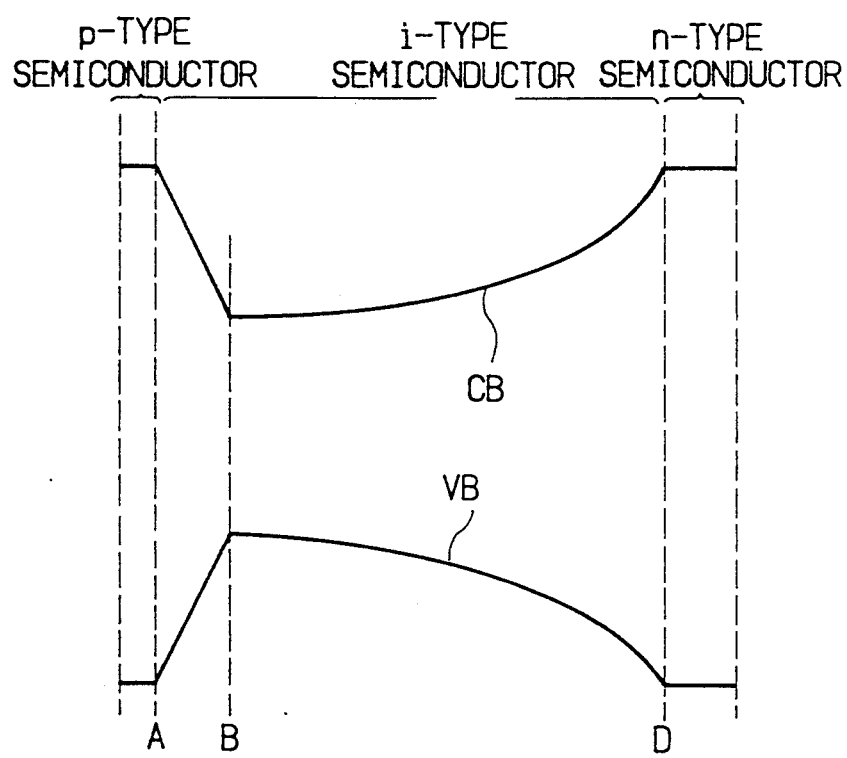
FIG. 4 is a schematic diagram illustrating the profile of the energy band gap in a further pin junction photovoltaic element of the present invention.

FIG. 4 is a schematic diagram illustrating the profile of an energy band of the semiconductor layer of a pin junction solar cell as a further example of the present invention in which the band gap is gradually and montonically graded from the minimum point B towards the interface D with the n-type semiconductor layer.

Figure 5:
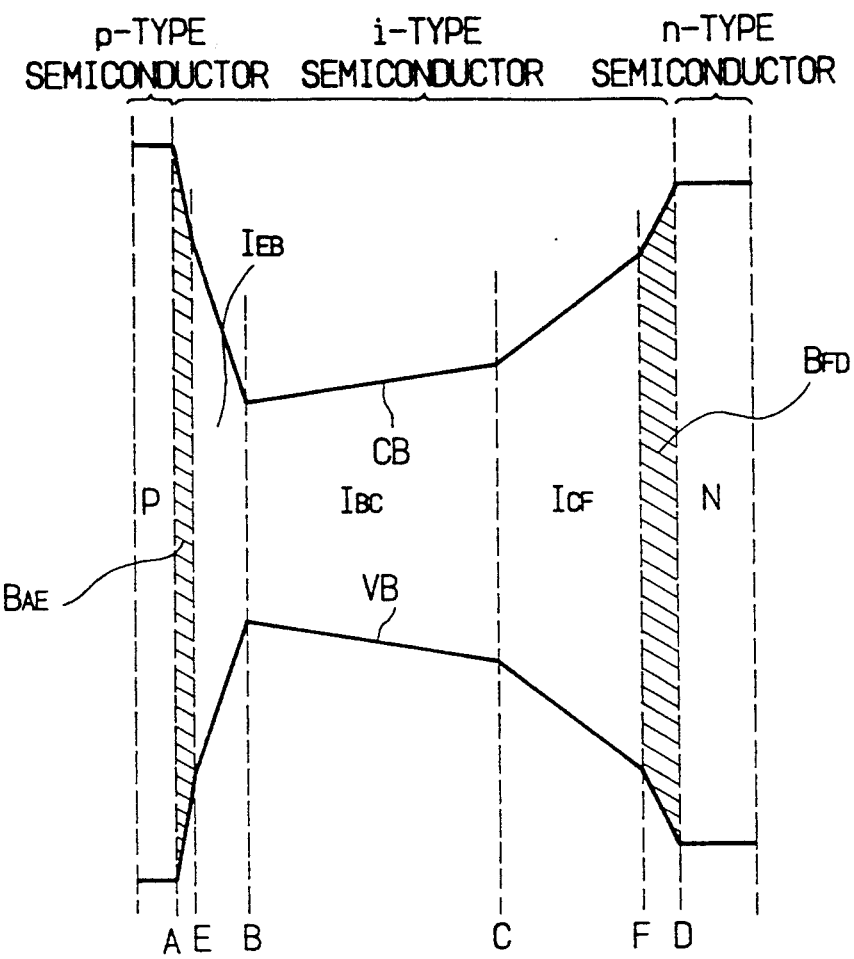
FIG. 5 is a schematic diagram illustrating the profile of the energy band gap in a still further pin junction photovoltaic element of the present invention.

FIG. 5 is a schematic diagram illustrating the profile of the energy band gap of the semiconductor 4 layer of a pin junction solar cell having an intermediate layer as a still further example to the present invention.

In the case of the pin junction solar cell shown in FIG. 1, the band gap may become discontinuous at the interface between the i-type semiconductor layer 104 and the n-type semiconductor layer 103 or at the interface between the i-type semiconductor layer 104 and the p-type semiconductor layer 105, depending upon the kind of constituent material used for the formation of each of said semiconductor layers.

In order to prevent such problem it is effective to dispose an appropriate layer capable of permitting the band gap to continuously vary therein (that is, an intermediate layer) at the interface portion of the i-type semiconductor layer 104 as shown in FIG. 5.

As a preferable example of the case where it is effective to dispose such an intermediate layer, there can be illustrated a pin junction solar cell in which the i-type semiconductor layer 104 is formed of a a-SiGe and the p-type semiconductor layer 105 is formed of a-SiC. In FIG. 5, each of the two hatched regions $B_{AE}$ and $B_{FD}$ corresponds to the intermediate layer.

In the case where a layer capable of permitting the band gap to continuously vary therein (that is, the intermediate layer) is disposed at the interface portion between the i-type semiconductor layer 104 and the n-type semiconductor layer 103 as above mentioned, one might think that this layer cannot be distinguished from the region $I_{DE}$ of the i-type semiconductor layer shown in FIG. 3. However, the intermediate layer $B_{FD}$ is disposed with a thickness of 500 Å or less from the interface with the n-type semiconductor layer 103.

When the band gap of the i-type semiconductor layer is different from that of the n-type semiconductor layer, there occurs an increase in recombination of photocarriers because of the presence of a high density of states at the interface between the two semiconductor layers. However, occurrence of this problem can be prevented by disposing the intermediate layer, whereby the open circuit voltage (Voc) is improved. The internal electric field of the interface is relatively large since the intermediate layer is situated at the interface portion.

Being different from the case where the intermediate layer is disposed, the gradient of the band gap of the region $I_{DE}$ of the i-type semiconductor layer situated on the side of the n-type semiconductor layer is continuously extended into the interior of the i-type semiconductor layer in the present invention. Hence, in the present invention, the gradient of the band gap of the region $I_{DE}$ on the side of the n-type semiconductor layer is situated at the portion in the i-type semiconductor layer where the internal electric field is relatively weak and because of this, said gradient contributes to promoting the transportation of minority carriers to thereby improve the fill factor (F.F.).

In the present invention, the value of the gradient of the band gap for each of the regions of the i-type semiconductor layer differs depending upon the kind of material used and also depending upon the entire thickness of the i-type semiconductor layer. However, in the case of using a-SiGe, the gradient of the band gap of, for example, the region $I_{BC}$ of the i-type semiconductor layer on the side near the minimum point of the band gap of the i-type semiconductor layer is preferably 0.1 to 0.5 eV/μm, more preferably 0.2 to 2 eV/μm, and the gradient of the band gap of, for example, the regions $I_{CD}$, $I_{CF}$, or $I_{DE}$ of the i-type semiconductor layer on the side near the n-type layer is preferably 0.5 to 60 eV/μm, more preferably 1.0 to 12 eV/μm.

In the present invention, the method of grading the band gap of the i-type semiconductor layer is different depending upon the kind of material of which the i-type semiconductor layer is formed. In the case where the i-type semiconductor layer is constituted by a material containing two or more elements, the band gap can be graded by changing the elemental composition ratio. For example, it is known that in the case where the composition ratio of Si/Ge as for a-SiGe which is suitable for a solar cell, its band gap can be substantially linearly changed depending upon changes in the elemental composition ratio of Si/Ge.

Thus, in the case where a material containing two or more elements is used to form the i-type semiconductor layer, the band gap thereof can be graded by continuously changing the elemental composition ratio thereof in the thickness direction in accordance with the above known method.

In addition to the above, for certain other materials of which the i-type semiconductor layer is constituted, the band gap can be graded by changing the hydrogen content or the size of crystal grains as desired.

n-Type Semiconductor Layer and p-Type Semiconductor Layer

The n-type semiconductor layer 103 may be constituted by any of the foregoing materials usable for the i-type semiconductor layer 104. Alternatively, the n-type semiconductor layer 103 may also be constituted by other materials having a band gap wider than that of a-Si, such as a-SiC, a-SiN, a-SiO, or the like.

In any case, these materials are made n-type by doping them with an appropriate dopant such as P, As, Sb, N, etc. upon forming the n-type semiconductor layer.

The p-type semiconductor layer 105 may be constituted by any of the materials usable for the n-type semiconductor layer 103.

As in the case of forming the n-type semiconductor layer 103, any of those materials is made p-type by doping it with an appropriate dopant such as B, Al, Ga, In, etc. upon forming the p-type semiconductor layer.

Both the n-type semiconductor layer 103 and the p-type semiconductor layer 105 are desired to be low in resistance, small in activation energy, and low in defects.

It is desired for the semiconductor layer positioned on the side through which light is impinged to have a wider band gap and to be thin so that light transmission therethrough is increased.

As for the thickness of each of the n-type semiconductor layer 103 and the p-type semiconductor layer 105, the optimum value thereof largely depends upon the kind of material to be used for their formation. However, in the case where each of the n-type semiconductor layer 103 and the p-type semiconductor layer 105 is constituted by a-Si, a-SiC, a-SiN, or a-SiO, the thickness of each is desired to be in the range of from 30 to 500 Å.

As above described, the foregoing pin junction solar call having the configuration show in FIG. 1 is of the type in which light is impinged from the side opposite the substrate 101. This configuration can be changed such that light is impinged from the side of the substrate.

Figure 6:
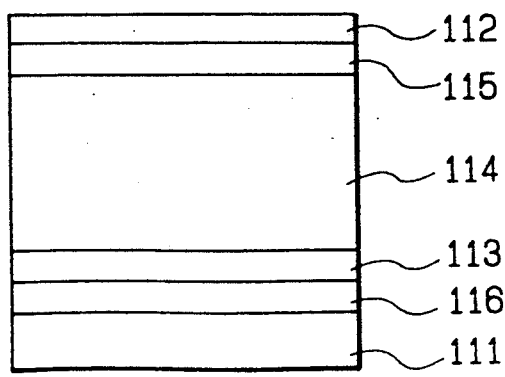
FIG. 6 is a schematic cross section view illustrating the constitutions of another pin junction hotovoltaic element of the present invention.

FIG. 6 is a schematic cross section view illustrating the configuration of a pin junction solar cell of the type in which light is impinged from the side of the substrate.

The pin junction solar cell shown in FIG. 6 comprises a transparent electrode 116, an n-type semiconductor layer 113, an i-type semiconductor layer 114, a p-type semiconductor layer 115, and an upper electrode 112 laminated in this order on a light transmissive substrate 111. Each of the transparent electrode 116, the n-type semiconductor layer 113, the i-type semiconductor layer 114, the p-type semiconductor layer 115, and the lower electrode 112 is formed in the same manner as above described, with respect to the pin junction solar cell shown in FIG. 1.

The substrate 111 in the pin junction solar cell shown in FIG. 6 is desired to have applied thereon with an electroconductive oxide thin film or a metallic thin film of a thickness capable of permitting light to transmit therethrough to the surface thereof. As the transparent electrode 116 is positioned between the substrate 111 and the n-type semiconductor layer 113, the transparent electrode is desired to be constituted by a material having a good adhesion not only with the substrate 111 but also with the n-type semiconductor layer 113.

The pin junction solar cell of the present invention may be a pin junction multicells-stacked solar cell comprising a plurality of pin junction photovoltaic elements, respectively, for example, of the same constitution as the pin junction element of the pin junction solar cell shown in FIG. 1.

In any case, for putting any of the above mentioned pin junction solar cells into practical use as a power source, it is used in the form of a solar cell module. Such solar cell module is prepared in a manner that a plurality of such solar cell units are electrically connected either in series or in parallel to thereby integrate them, thereby obtaining an integrated body. A layer capable of protecting the surface thereof is mounted to the integrated body, and output terminals are provided to the resultant.

The present invention will be described more specifically while referring to Examples, but the present invention is not limited in scope to only these examples.

EXAMPLE 1

Figure 7:
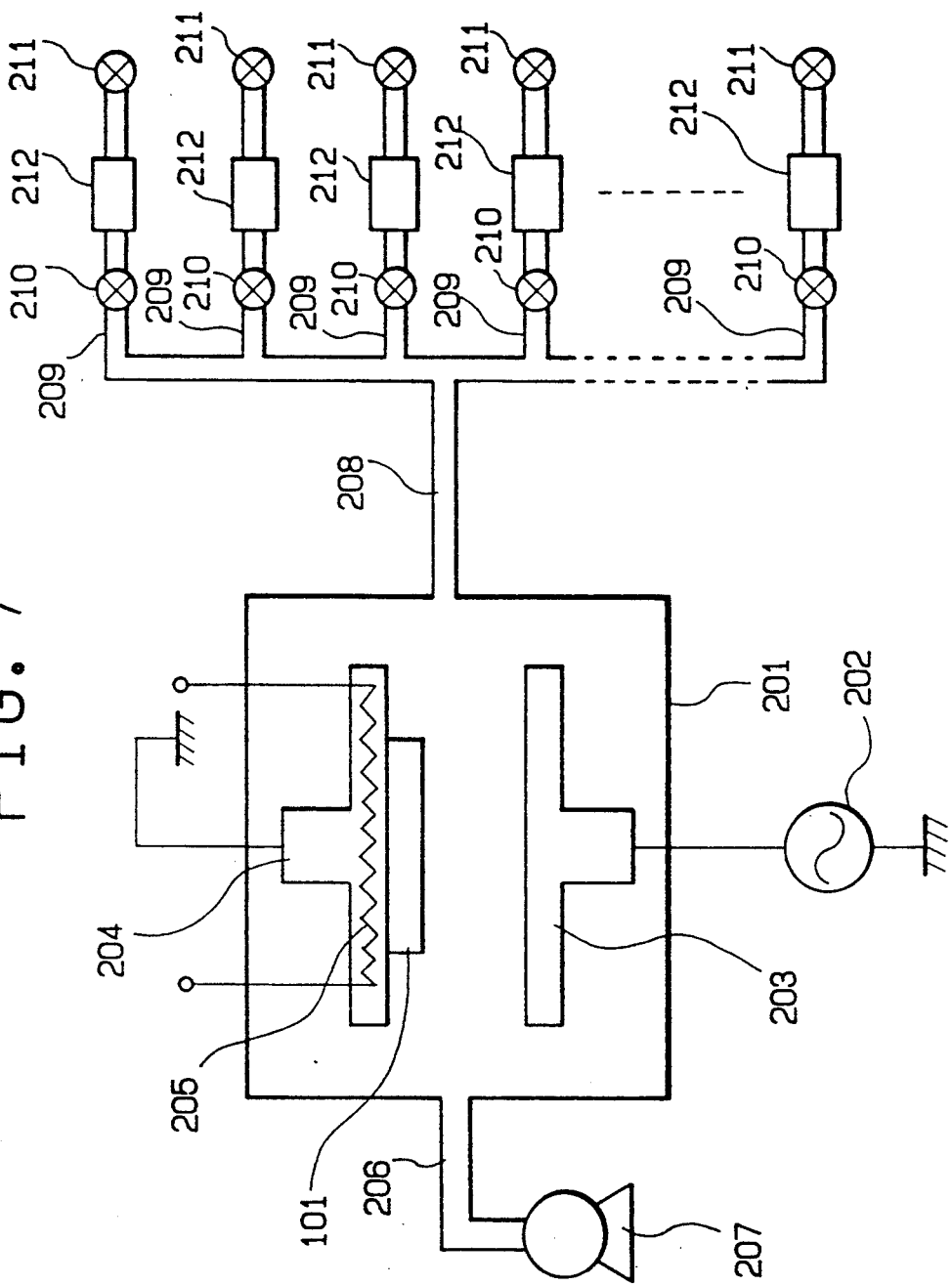
FIG. 7 is a schematic explanatory view illustrating a film-forming apparatus to be used for the preparation of a pin junction photovoltaic element of the present invention.

There was prepared a pin junction solar cell of the configuration shown in FIG. 1 in which the i-type semiconductor layer 104 comprises a-SiGe, using the film-forming apparatus shown in FIG. 7.

Firstly, a description will be given of the film-forming apparatus shown in FIG. 7.

This film-forming apparatus serves to form a deposited film on a substrate by means of a high frequency plasma CVD process, and it is of known constitution.

In the figure, reference numeral 201 indicates a deposition chamber provided with a gas feed pipe 208 serving to introduce a film-forming raw material gas into said deposition chamber and an exhaust pipe 206 connected through an exhaust valve (not shown) to a vacuum pump 207.

In the deposition chamber 201, there are installed a substrate holder 204 and a high frequency electrode 203 opposite to said substrate holder. The substrate holder 204 is constituted by a conductive material, and it is electrically grounded. Reference numeral 101 indicates a substrate placed on the surface of the substrate holder 204. Reference numeral 205 indicates an electric heater installed in the substrate holder 204. The electric heater 205 serves to heat the substrate 101. The high frequency electrode 203 is electrically connected through a matching box (not shown) to a high frequency power source 202 which is electrically grounded.

The other end of the gas feed pipe 208 is connected to raw material gas reservoirs (not shown) through branch pipes 209 provided with exit valves 210, mass flow controllers 212 and main valves 211 for the reservoirs. An appropriate raw material gas is stored in each of the reservoirs. The raw material gas from each of the reservoirs is introduced into the deposition chamber 201 through the main valve 211, the mass flow controller 212, the exit valve 210 and the gas feed pipe 208 while its flow rate is being controlled.

The flow rate of each of the film-forming raw material gases to be thus introduced into the deposition chamber 201 upon film formation can be changed as desired by controlling the corresponding mass flow controller.

Each of the mass flow controllers 212 is designed such that it can be controlled by a microcomputer (not shown). Thus, a desired flow rate pattern can be attained by programming said microcomputer.

Film formation in this film-forming apparatus is performed, for example, in such a manner that the inside of the deposition chamber 201 is evacuated to a predetermined vacuum degree by the action of the vacuum pump 207, one or more kinds of film-forming raw material gases are introduced thereinto through the gas feed pipe 208 while controlling their flow rates as desired, simultaneously the high frequency power source 202 is switched on to apply a predetermined high frequency power to the high frequency electrode 203 to thereby cause a glow discharge, thereby forming a deposited film on the surface of the substrate 101 maintained at a desired temperature.

Film formation in this example using the film-forming apparatus shown in FIG. 7 was performed as follows.

As the substrate 101, there was provided a SUS 304 stainless steel plate of 5 cm×5 cm in size having a mirror ground uneven surface of 0.05 μm in Rmax.

On the surface of this substrate 101 were successively formed a 1000 Å thick Ag film and 4000 Å thick ZnO film to be the lower electrode 102 by a conventional high frequency sputtering method. At the time of forming said Ag thin film, the substrate was maintained at about 300° C. in order to make the surface of said Ag film uneven (i.e. textured).

Figure 8:
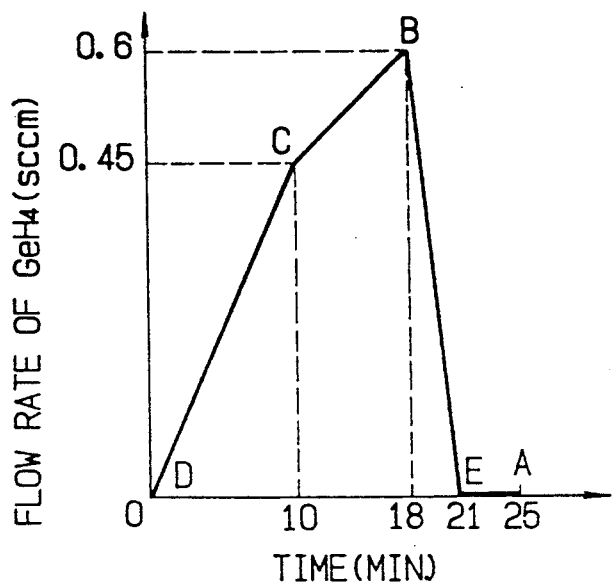
FIG. 8 is a schematic diagram illustrating the film-forming conditions employed in Example 1 of the present invention which will be later described.

The substrate having the lower electrode 102 formed thereon was placed on the surface of the substrate holder 204 of the film-forming apparatus shown in FIG. 7. Then, the inside of the deposition chamber 201 was evacuated by actuating the vacuum pump 207 to bring it to a vacuum degree of about $1 \times 10^{-6}$ Torr. The vacuum degree was measured by an ion gage (not shown). The heater 205 was actuated to heat the substrate 101 to abut 300° C. After the temperature of the substrate 101 became constant at this temperature, the main valve 211 and the exit valve 210 were operated to introduce $Si_2H_6$ gas into the deposition chamber 201 at a flow rate of 1 sccm while controlling its flow rate by means of the mass flow controller 212. Likewise, $H_2$ gas and $PH_3/H_2$ gas (diluted to 5%) were introduced into the deposition chamber 201 at respective flow rates of 50 sccm and 1 sccm. The gas pressure in the deposition chamber 201 was adjusted to and maintained at 1.2 Torr. Then, the high frequency power source 202 was switched on to apply a high frequency power of 1.5 W to the high frequency electrode 203, to thereby cause a glow discharge in the deposition chamber. This film forming procedure was continued for 2 minutes. As a result, an about 200 Å thick n-type a-Si:H film as the n-type semiconductor layer 103 was formed on the lower electrode 102. The application of the high frequency power and the introduction of the gases were then suspended. The inside of the deposition chamber 201 was evacuated to a vacuum degree of about $1 \times 10^{-6}$ Torr. Then film formation was performed in the same manner as in the case of forming the n-type semiconductor layer 103 under the following conditions:

(1) raw material gases used & their flow rates:
$Si_2H_6$ gas: 0.65 sccm
$H_2$ gas: 50 sccm
$GeH_4$ gas: the flow rate was changed following the flow rate pattern shown in FIG. 8 while controlling the corresponding mass flow controller by a microcomputer (2) the gas pressure in the deposition chamber:
1.15 Torr (3) high frequency power applied:
1.3 W (4) time of film formation:
25 minutes As a result, there was formed a non-doped a-SiGe:H film as the i-type semiconductor layer 104 on the previously formed n-type semiconductor layer.

Figure 9:
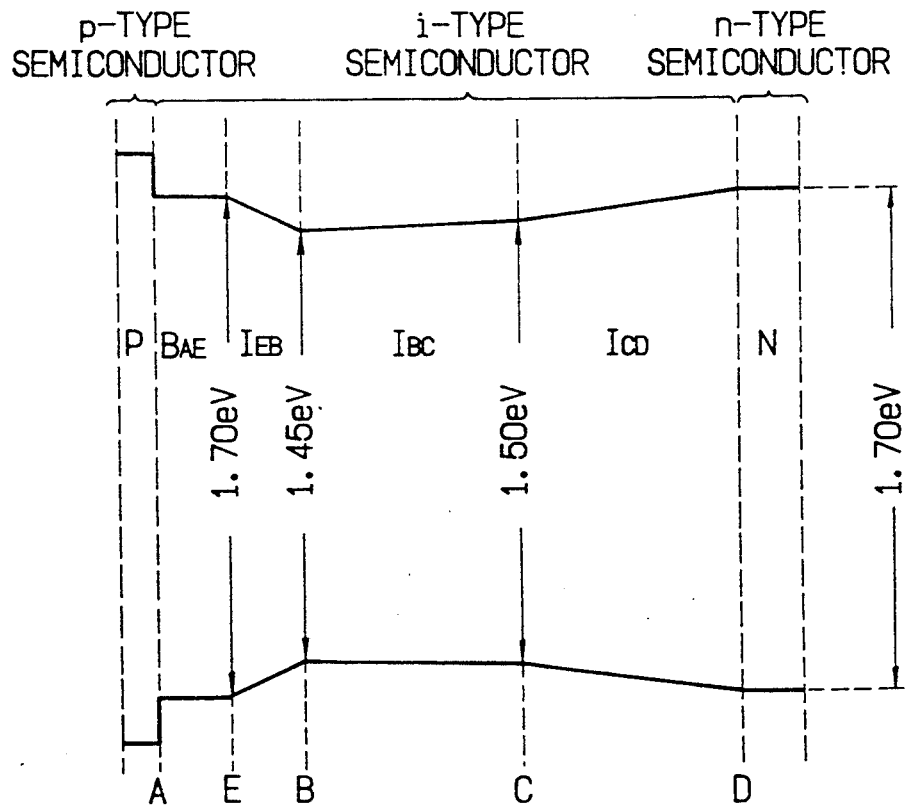
FIG. 9 is a schematic diagram illustrating the profile of the energy band gap in the pin junction photovoltaic element obtained in said Example 1.

As was apparent from the measured results which will be later described, the resultant non-doped a-SiGe:H film was found to have a band gap graded in the thickness direction as shown in FIG. 9.

After the formation of the i-type semiconductor layer was completed, the application of the high frequency power and the introduction of the gases were suspended.

The inside of the deposition chamber 201 was evacuated to a vacuum degree of about $1 \times 10^{-6}$ Torr.

Then the p-type semiconductor layer 105 was formed in the same manner as in the case of forming the n-type semiconductor layer 103 under the following conditions: raw material gases used and their flow rates:

(1) $SiH_4/H_2$ gas (diluted to 5%): 1 sccm
$H_2$ gas: 75 sccm
$BF_3/H_2$ gas (diluted to 2%): 1 sccm (2) the gas pressure in the deposition chamber:
1.1 Torr (3) high frequency power applied:
50 W (4) film formation time:
0.5 minutes As a result, there was formed a 60 Å thick p-type microcrystal Si:H film as the p-type semiconductor layer 105 on the previously formed i-type semiconductor layer 104.

After the formation of the p-type semiconductor layer 105 was completed, the application of the high frequency power and the introduction of the gases were terminated. The resultant was cooled, and it was transferred into a conventional vacuum deposition apparatus, wherein on the previously formed p-type semiconductor layer there was formed a 700 Å thick ITO film as the transparent electrode 106.

Thus, there was obtained a sample pin junction solar cell element.

The sample thus obtained was cut into a plurality of specimens respectively of 1 cm×1 cm in size. On each of the specimens was formed an aluminum thin film as the collecting electrode 107 by a conventional electron beam deposition process. Thus, there were obtained a plurality of solar cell samples.

For each of the solar samples, the photoelectric characteristics were examined by subjecting it to irradiation with AM-1.5 light of 100 mW/cm$^2$ intensity, which has a spectrum approximate to that of sunlight in terms of AM value, using a solar simulator with a xenon lamp.

Of these solar cell samples, 10 samples which were substantially uniform in view of their examined characteristics were evaluated with respect to open circuit voltage (Voc), short circuit current per unit area (Joc), fill factor (F.F.), and photoelectric conversion efficiency (η) by a conventional method. The results obtained are shown in Table 2. Each of the values shown in Table 2 is a mean value from the 10 solar cell samples.

In addition, AM-1.5 light of 100 mW/cm² intensity was irradiated through a filter (which blocks transmission of light of less than 600 nm in wavelength) to each of the solar cell samples, to thereby examine its long wavelength light characteristics with respect to the same evaluation items as in the above.

The results obtained are shown in Table 3. Each of the evaluated values shown in Table 3 is a mean value from the 10 solar cell samples.

Independently, the above procedures of forming the i-type semiconductor layer 104 were repeated to form a nondoped a-SiGe:H film on a glass plate. As for the resultant a-SiGe:H film, the profile of the optical band gap (Eg opt) was observed based on the wavelength properties in the relation between a given wavelength and light extinction coefficient which were obtained in accordance with a conventional optical band gap evaluating method, for example, disclosed in "The Basis of Amorphous Semiconductor", edited by M. Kikuchi et al, pp. 90-92, published by Kabushiki Kaisha Ohm Sha, May 10, 1983).

In addition, the Ge content was observed by a commercially available X-ray microanalyzer (XMA). The observed results are collectively shown in Table 1.

Also, the results given in Table 1 are graphically illustrated in FIG. 9. From Table 1 and FIG. 9, it is understood that the gradient of the optical band gap in the region of the i-type semiconductor layer 104 situated on the side of the n-type semiconductor layer 103, that is, in the region between C and D in FIG. 9, is 2.7 eV/μm; the gradient of the optical band gap between the minimum point B of the optical band gap of the i-type semiconductor layer and said point C is 0.67 eV/μm; and the gradient of the former optical band gap is greater than that of the latter optical band gap.

EXAMPLE 2

In this example, there was prepared a pin junction solar cell of the configuration shown in FIG. 1 in which the i-type semiconductor layer 104 comprises a-SiGe, repeating the procedures of Example 1, except for changing the flow rate pattern of the GeH₄ gas during the formation of the i-type semiconductor layer.

Figure 10:
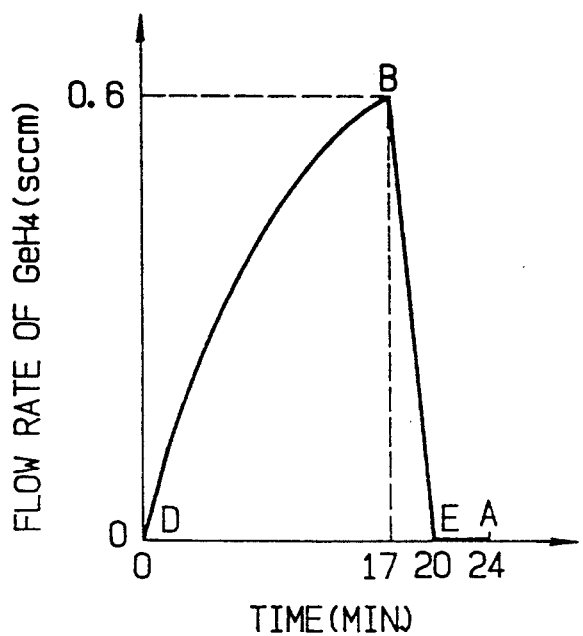
FIG. 10 is a schematic diagram illustrating the film-forming conditions employed in Example 2 of the present invention which will be later described.
Figure 11:
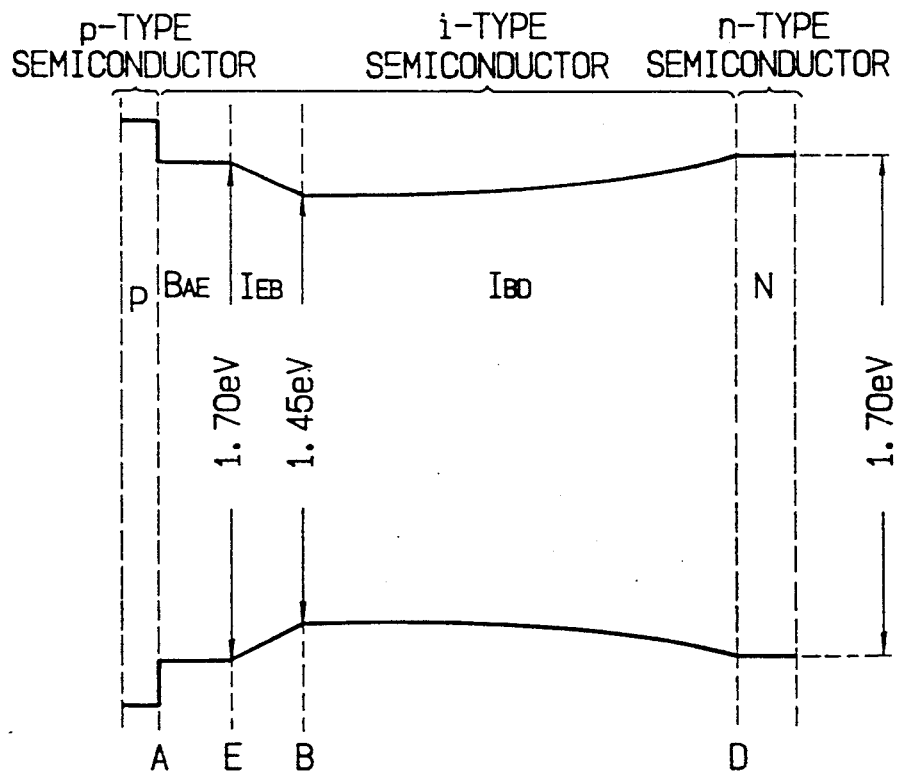
FIG. 11 is a schematic diagram illustrating the profile of the energy band gap in the pin junction photovoltaic element obtained in said Example 2.

That is, the i-type layer comprising a-SiGe:H film was formed by repeating the same procedures of forming the i-type semiconductor layer 104 in Example 1, except that GeH₄ gas was introduced into the deposition chamber 201 following the flow rate pattern shown in FIG. 10. Particularly in this respect, the mass flow controller for the GeH₄ gas was controlled so that the flow rate of GeH₄ gas followed the convex curve from the interface (point D in FIG. 10) with the n-type semiconductor layer 103 to the minimum point (point B in FIG. 10) of the band gap of the i-type semiconductor layer to be formed. In this case, it was estimated that there would result a band gap continuously and gently graded from the minimum point towards the n-type semiconductor layer 103 and steeply graded as it reaches the n-type semiconductor layer 103 as shown in FIG. 11. In the process of forming the i-type semiconductor layer, for the last 4 minutes, film formation was performed without introducing the GeH gas into the deposition chamber 201 (see FIG. 10), to thereby form an intermediate layer ($B_{AE}$ in FIG. 11) comprising a-Si:H at the interface portion with the p-type semiconductor layer 105.

Thus, there was obtained a sample pin junction solar cell element.

The sample thus obtained was cut into a plurality of specimens respectively of 1 cm × 1 cm in size. On each of the specimens was formed an aluminum thin film as the collecting electrode 107 by a conventional electron beam deposition process. Thus, there were obtained a plurality of solar cell samples.

These solar cell samples-were examined in the same manner as in Example 1.

Of these solar cell samples, 10 samples which were substantially uniform in view of their examined characteristics were evaluated with respect to open circuit voltage (Voc), short circuit current per unit area (Joc), fill factor (F.F.), and photoelectric conversion efficiency (η) by a conventional method. The results obtained are shown in Table 2. Each of the evaluated values shown in Table 2 is a mean value from the 10 solar cell samples.

In addition, AM-1.5 light of 100 mW/cm² intensity was irradiated through a filter (which blocks transmission of light of less than 600 nm in wavelength) to each of the solar cell samples, to thereby examine its long wavelength characteristics with respect to the same evaluation items as in the above.

The results obtained are shown in Table 3. Each of the evaluated values shown in Table 3 is a mean value from the 10 solar cell samples.

COMPARATIVE EXAMPLE 1

For comparison purposes, there was prepared a comparative pin junction a-SiGe solar cell of known constitution, which does not have any gradient in the band gap of the i-type semiconductor layer.

Figure 16:
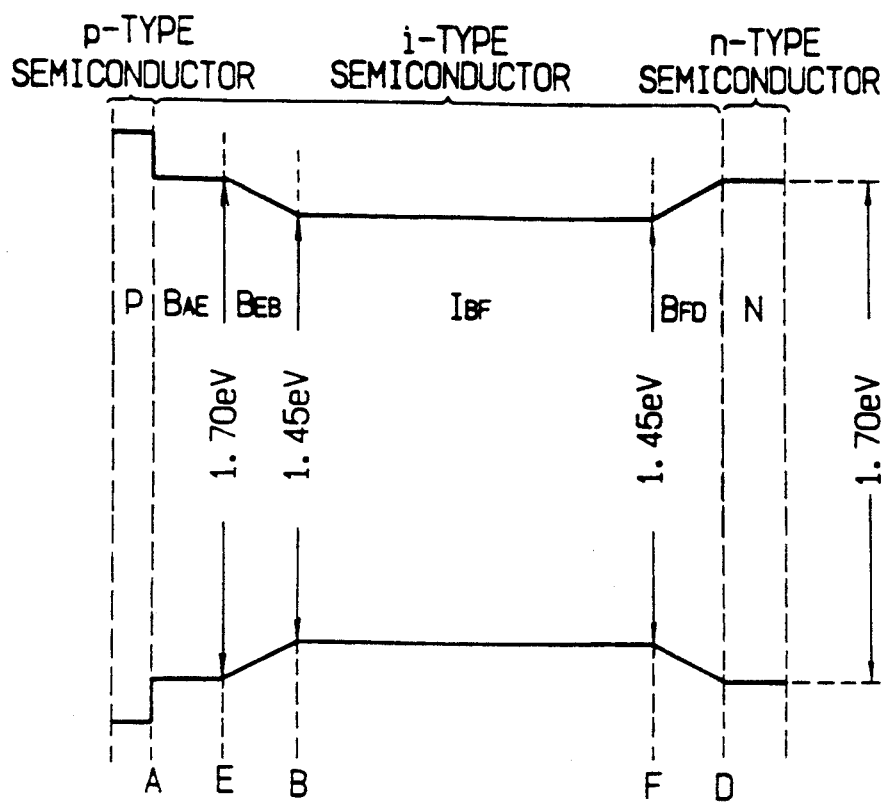
FIG. 16 is a schematic diagram illustrating the profile of the energy band gap in a known pin junction photovoltaic element.

FIG. 16 shows the profile of the energy band gap of this solar cell. In this solar cell, there are provided an intermediate layer $B_{AE}$, a graded intermediate layer $B_{EB}$, and a graded intermediate layer $B_{FD}$ in the i-type semiconductor layer in order to reduce a discontinuation in the band gap at the interface between the p-type semiconductor layer and the i-type semiconductor layer and at the interface between the n-type semiconductor layer and the i-type semiconductor layer and in order to reduce interface states. The optical band gap (Eg opt) of the region $I_{BF}$ in the i-type semiconductor layer is 1.45 eV.

The comparative pin junction a-SiGe solar cell was prepared by repeating the procedures of Example 1, except for the step of forming the i-type semiconductor layer.

That is, the i-type layer of the comparative pin junction solar cell was formed by repeating the same procedures of forming the i-type semiconductor layer 104 in Example 1, except that GeH₄ gas was introduced into the deposition chamber 201 while controlling the flow rate thereof from 0 sccm to 0.6 sccm, to thereby form a 2,000 Å thick i-type film as the i-type semiconductor layer containing the foregoing intermediate layer and the foregoing two graded intermediate layers $B_{EB}$ and $B_{FD}$ shown in FIG. 16.

Thus, there was obtained a comparative pin junction solar cell element sample.

The sample thus obtained was cut into a plurality of specimens respectively of 1 cm × 1 cm in size. On each of the specimens was formed an aluminum thin film as the collecting electrode 107 by a conventional electron beam deposition process. Thus, there was obtained a plurality of solar cell samples.

These solar cell samples were examined in the same manner as in Example 1.

Of these solar cell samples, 10 samples which were substantially uniform in view of their examined characteristics were evaluated with respect to open circuit voltage (Voc), short circuit current per unit area (Joc), fill factor (F.F.), and photoelectric conversion efficiency ($\eta$) by a conventional method. The results obtained are as shown in Table 2. Each of the values shown in Table 2 is a mean value from the 10 solar cell samples.

In addition, AM-1.5 light of 100 mW/cm$^2$ intensity was irradiated through a filter (which blocks transmission of light of less than 600 nm in wavelength) to each of the solar cell samples, to thereby examine its long wavelength characteristics with respect to the same evaluation items as in the above.

The results obtained are shown in Table 3. Each of the values shown in Table 3 is a mean value from the solar cell samples.

COMPARATIVE EXAMPLE 2

For comparison purposes, there was prepared a solar cell of the same constitution as disclosed in U.S. Pat. No. 4,816,082. This solar cell has an energy band gap profile as shown in FIG. 17.

This solar cell is such that the band gap of region I$_{BC}$ comprising an i-type semiconductor adjacent to the n-type semiconductor layer is widened on the side of the n-type semiconductor layer, the band gap is minimum at the boundary portion between region I$_{EB}$ and region I$_{BC}$ of the i-type semiconductor layer, and an intermediate layer B$_{AE}$ is present between the p-type semiconductor region P and the region I$_{EB}$.

This comparative solar cell was prepared by repeating the procedures of Example 1, except for the step of forming the i-type semiconductor layer.

Figure 17:
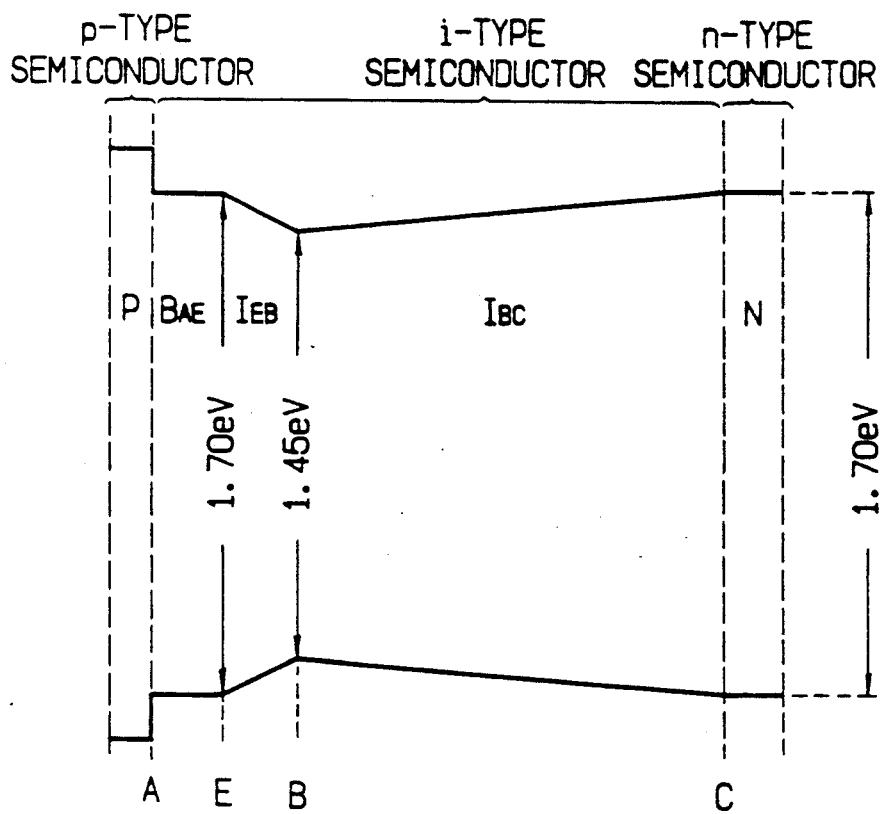
FIG. 17 is a schematic diagram illustrating the profile of the energy band gap in another known pin junction photovoltaic element.

That is, the i-type layer of the comparative pin junction solar cell was formed by repeating the same procedures of forming the i-type semiconductor layer 104 in Example 1, except the GeH$_4$ gas was introduced into the deposition chamber 201 while controlling the flow rate thereof from 0 sccm to 0.6 sccm, to thereby form a 200 Å thick i-type semiconductor layer having the band gap constitution shown in FIG. 17.

Thus, there was obtained a sample comparative pin junction solar cell element.

The sample thus obtained was cut into a plurality of specimens respectively of 1 cm $\times$ 1 cm in size. On each of the specimens was formed an aluminum thin film as a collecting electrode 107 by a conventional electron beam deposition process. Thus, there was obtained a plurality of solar cell samples.

These solar cell samples were examined in the same manner as in Example 1.

Of these solar cell samples, 10 samples which were substantially uniform in view of their examined characteristics were evaluated with respect to open circuit voltage (Voc), short circuit current per unit area (Joc), fill factor (F.F.), and photoelectric conversion efficiency ($\eta$) by a conventional method. The results obtained are as shown in Table 2. Each of the values shown in Table 2 is a mean value from the 10 solar cell samples.

In addition, AM-1.5 light of 100 mW/cm$^2$ intensity was irradiated through a filter (which blocks transmission of light of less than 600 nm in wavelength) to each of the solar cell samples, to thereby examine its long wavelength characteristics with respect to the same evaluation items as in the above.

The results obtained are shown in Table 3. Each of the values shown in Table 3 is a mean value from the 10 solar cell samples.

COMPARATIVE EVALUATION

Comparative studies were made of the solar cells obtained in Examples 1 and 2 and Comparative Examples 1 and 2.

By comparing each of the solar cells obtained in Examples 1 and 2 with the comparative solar cell obtained in Comparative Example 1, it is understood that any of the solar cells obtained in Examples 1 and 2 surpasses the comparative solar cell obtained in Comparative Example 1, particularly with respect to open circuit voltage (Voc), fill factor (F.F.), and photoelectric conversion efficiency.

By comparing each of the solar cells obtained in Examples 1 and 2 with the comparative solar cell obtained in Comparative Example 2, it is understood that any of the solar cells obtained in Examples 1 and 2 surpasses the comparative solar cell obtained in Comparative Example 2, particularly with respect to short circuit current, fill factor (F.F.), and photoelectric conversion efficiency.

Further, by comparing each of the solar cells obtained in Examples 1 and 2 with each of the comparative solar cells obtained in Comparative Examples 1 and 2, it is understood that the former is surpasses the latter in terms of photoelectric conversion efficiency for long wavelength light of more than 600 nm in wavelength.

EXAMPLE 3

There was prepared a pin junction solar cell of the configuration shown in FIG. 6 in which the i-type semiconductor layer 104 comprises a-SiGe, using a film-forming apparatus shown in FIG. 7.

Film formation using the film-forming apparatus shown in FIG. 7 in this example was performed as follows.

As the substrate 111, there was employed an alkali-free glass (commercially available under the trade name: No.7059 glass, produced by Corning Glass Works Company) of 5 cm $\times$ 5 cm in size.

On the surface of this substrate 111 were successively formed a 1800 Å thick ITO film and a 200 Å thick SnO$_2$ film as the transparent electrode 116 by a conventional vacuum deposition method, followed by subjecting to patterning into a lattice pattern.

The substrate having the transparent electrode 116 formed thereon was placed on the surface of the substrate holder 204 of the film-forming apparatus shown in FIG. 7. Then, the inside of the deposition chamber 201 was evacuated by actuating the vacuum pump 207 to bring it to a vacuum degree of about 1 $\times$ 10$^{-6}$ Torr. The vacuum degree in this case was by an ion gage (not shown). The heater 205 was actuated to heat the substrate 111 to about 260° C. After the temperature of the substrate 111 became constant at this temperature, the main valve 211 and the exit valve 210 were operated to introduce Si$_2$H$_6$ gas into the deposition chamber 201 at a flow rate of 1 scmm while controlling its flow rate by means of the mass flow controller 212. Likewise, H$_2$ gas and PH$_3$/H$_2$ gas (diluted to 5%) and CH$_4$ gas were introduced into the deposition chamber 201 at respective flow rates of 50 sccm, 1 sccm, and 4 sccm. The gas pressure in the deposition chamber 201 was adjusted to and maintained at 1.2 Torr. Then, the high frequency power source 202 was switched on to apply a high frequency power of 1.5 W to the high frequency electrode 203, to thereby cause a glow discharge in the deposition chamber.

This film forming procedure was continued for 2 minutes. As a result, an about 120 Å thick n-type a-SiC:H film as the n-type semiconductor layer 113 was formed on the transparent electrode 116. The application of the high frequency power and the introduction of the gases were then suspended. The inside of the deposition chamber 201 was evacuated to a vacuum degree of about $1 \times 10^{-6}$ Torr.

Figure 12:
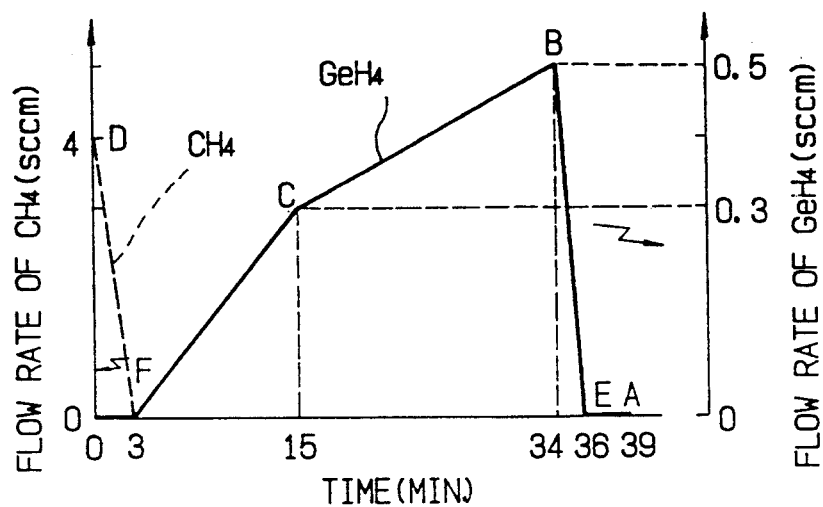
FIG. 12 is a schematic diagram illustrating the film-forming conditions employed in Example 3 of the present invention which will be later described.

Then, the procedures for forming the i-type semiconductor layer were repeated while maintaining the substrate at 260° C., wherein the flow rate of the GeH$_4$ gas was changed from 0 sccm to 0.5 sccm following the flow rate pattern shown in FIG. 12 while controlling the corresponding mass flow controller by a microcomputer, except that during the first 3 minute period from the start of film formation, an intermediate layer comprising a-SiC:H was formed in the region adjacent to the n-type semiconductor layer by introducing CH$_4$ gas at a linearly reducing flow rate starting at 4 sccm and ending at 0 sccm at the end of the 3 minute period as shown in FIG. 12, while not introducing the GeH gas, and, during the last 3 minute period, another intermediate layer comprising a-Si:H was formed without introducing the GeH$_4$ gas. As a result, there was formed an about 3250 Å thick i-type semiconductor layer 114 containing the foregoing two intermediate layers on the previously formed n-type layer.

Figure 13:
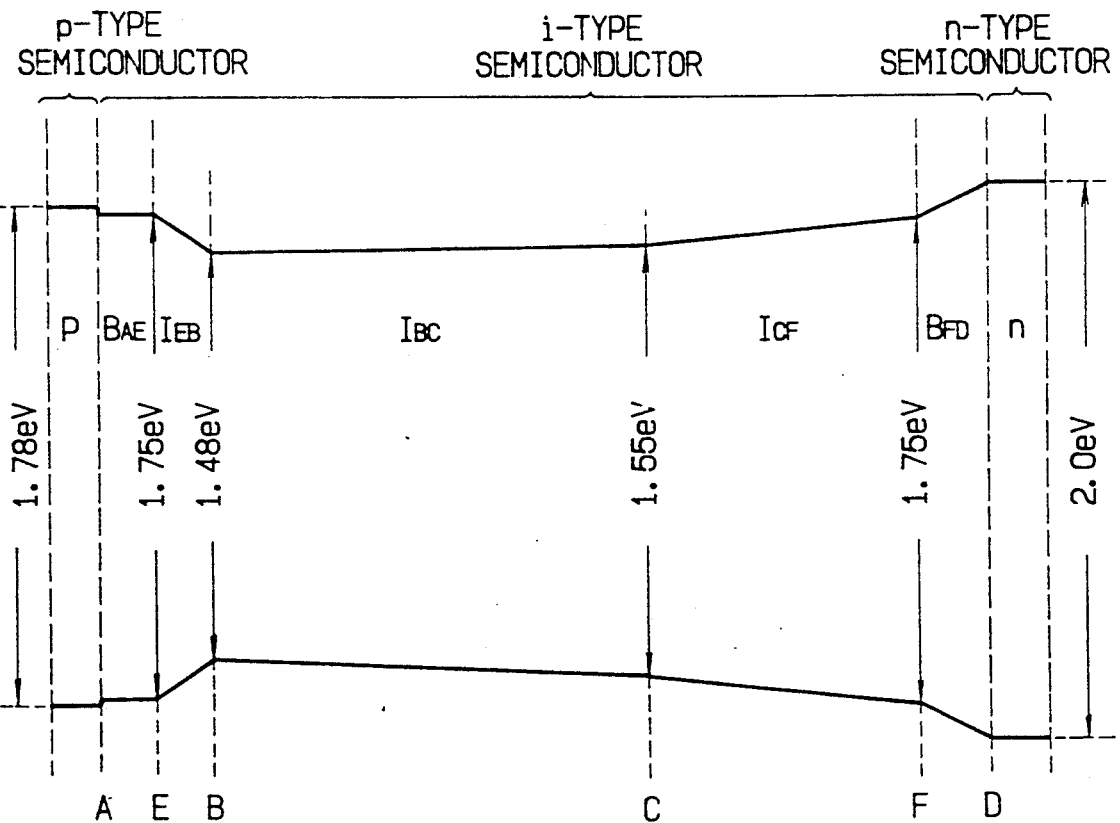
FIG. 13 is a schematic diagram illustrating the profile of the energy band gap in the pin junction photovoltaic element obtained in said Example 3.

As will be apparent from the observed results which will be later described, the resultant i-type semiconductor layer was found to have a band gap structure as shown in FIG. 13. In FIG. 13, the region B$_{FD}$ corresponds to the former intermediate layer and the region B$_{AE}$ corresponds to the latter intermediate layer.

After the formation of the i-type semiconductor layer was completed, the application of the high frequency power and the introduction of the gases were suspended.

The inside of the deposition chamber 201 was evacuated to a vacuum degree of about $1 \times 10^{-6}$ Torr.

Then the p-type semiconductor layer 115 was formed in the same manner as in the case of forming the n-type semiconductor layer 113 under the following conditions:

(1) Raw material gases used and their flow rates:
Si$_2$H$_6$ gas: 1 sccm
H$_2$ gas: 75 sccm
B$_2$H$_6$/H$_2$ gas (diluted to 2%): 1 sccm
(2) the gas pressure in the deposition chamber:
1.0 Torr
(3) high frequency power applied:
2 W As a result, there was formed a 200 Å thick p-type a-Si:H film as the p-type semiconductor layer 115 on the previously formed i-type semiconductor layer 114.

After the formation of the p-type semiconductor layer 105 was completed, the application of the high frequency power and the introduction of the gases were terminated. The resultant was cooled, and was transferred into a conventional vacuum deposition apparatus, wherein on the previously formed p-type semiconductor layer were successively formed a 200 Å thick Cr film and a 1800 Å thick Al film as the lower electrode 112, followed by subjecting to patterning.

Thus, there was obtained a sample pin junction solar cell element.

The sample thus obtained was cut into a plurality of specimens 1 cm × 1 cm in size.

For each of the solar cell samples, the photoelectric characteristics were examined in the same manner as in Example 1.

Of these solar cell samples, 10 solar cell samples which were substantially uniform in view of their examined characteristics were evaluated with respect to open circuit voltage (Voc), short circuit per unit area (Joc), fill factor (F.F.), and photoelectric conversion efficiency ($\eta$) by a conventional method. The results obtained were are shown in Table 5. Each of the evaluated values shown in Table 5 is a mean value from the 10 solar cell samples.

In addition, AM-1.5 light of 100 Mw/cm$^2$ intensity was irradiated through a filter (which blocks transmission of light of less than 600 nm in wavelength) to each of the solar cell samples, to thereby examine its long wavelength characteristics with respect to the same evaluation items as in the above.

The results obtained are shown in Table 5. Each of the evaluated values shown in Table 5 is a mean value from the 10 solar cell samples.

Independently, for the above i-type semiconductor layer, the optical band gap and the Ge content were observed in the same manner as in Example 1. The results obtained are shown in Table 4. The results contained in Table 4 are graphically illustrated in FIG. 13.

From the results obtained, it was found that each of the solar cell samples obtained in this example is satisfactory in photovoltaic characteristics.

EXAMPLE 4

Figure 14:
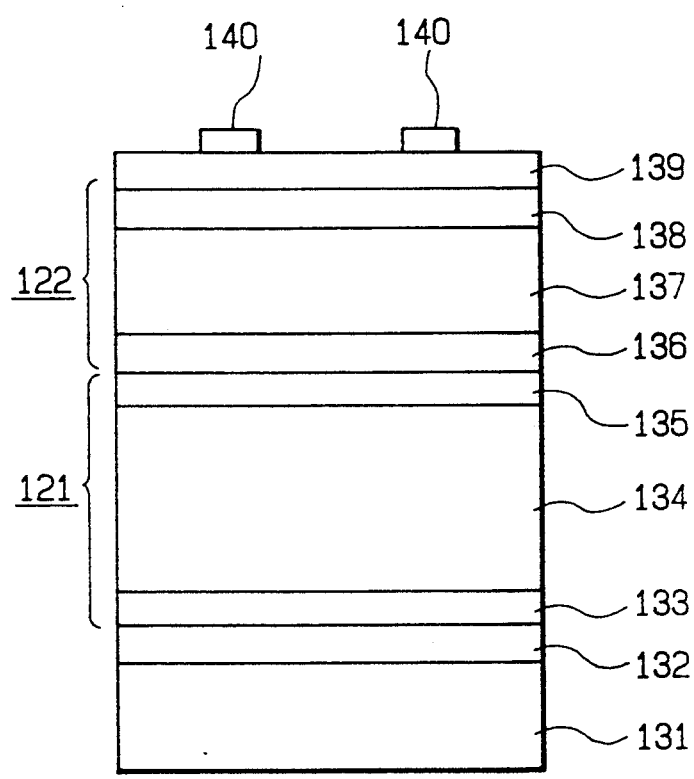
FIG. 14 is a schematic cross section view illustrating the constitution of the pin junction photovoltaic element obtained in Example 4 of the present invention which will be later described.

There was prepared a pin junction tandem type solar cell comprising two stacked pin junction solar cell units of the configuration shown in FIG. 14.

The pin junction tandem type solar cell shown in FIG. 14 comprises a lower electrode 132, a first pin junction cell unit 121 (comprising a first n-type semiconductor layer 133, a first i-type semiconductor layer 134, and a first p-type semiconductor layer 135), a second pin junction solar cell unit 122 (comprising a second n-type semiconductor layer 136, and a second p-type semiconductor layer 138) and a transparent electrode 139, stacked in this order on a substrate 131. Reference numeral 140 indicates a collecting electrode disposed on the transparent electrode 139.

In this pin junction tandem type solar cell, the first i-type semiconductor layer 134 has a band gap graded in the thickness direction as in the i-type semiconductor layer of the pin junction solar cell obtained in Example 1, but the second i-type semiconductor layer 137 does not have such a graded band gap.

This pin junction tandem type solar cell was prepared in the following manner.

As the substrate 131, there was provided a SUS 304 stainless steel plate.

On the surface of this substrate 131 there were successively formed a 1000 Å thick Ag film and a 4000 Å thick ZnO film as the lower electrode 132 by a conventional high frequency sputtering method.

The substrate having the lower electrode 132 formed thereon was then placed on the surface of the substrate holder 204 of the film-forming apparatus shown in FIG. 7.

Then, by repeating the procedures of Example 1, on the lower electrode 132 were formed the first n-type semiconductor layer 133 and the first i-type semiconductor layer 134. Thereafter, the procedures for forming the p-type semiconductor layer were repeated, except that the substrate temperature was changed to 260° C., to thereby form the first p-type semiconductor layer 135. Thus, there was formed the first pin junction solar cell unit 121.

The procedures of Example 1 for forming the n-type semiconductor layer were then repeated, except that the substrate temperate was changed to 240° C., to thereby form the second n-type semiconductor layer 136 of 180 Å in thickness on the previously formed first p-type semiconductor layer 135.

The application of the high frequency power and the introduction of the gases were then suspended. The inside of the deposition chamber 201 was evacuated to a vacuum degree of about $1 \times 10^{-6}$ Torr. The formation of the second i-type semiconductor layer 137 was performed in the same manner as in the case of forming the n-type semiconductor layer in Example 1 and under the following conditions:

(1) raw material gases used & their flow rates:
$Si_2H_6$ gas: 1 sccm
$H_2$ gas: 50 sccm
(2) the gas pressure in the deposition chamber:
1.15 Torr
(3) high frequency power applied:
1.2 W
(4) substrate temperature:
240° C.
(5) film formation time:
30 minutes As a result, there was formed a non-doped a-Si:H film as the second i-type semiconductor layer 137 on the previously formed second n-type semiconductor layer 136.

The procedures of Example 1 for forming the p-type semiconductor layer were then repeated, except that the substrate temperature was changed to 200° C., to thereby form the second p-type semiconductor layer 138 of 50 Å in thickness on the previously formed second i-type semiconductor layer 137.

After the formation of the second p-type semiconductor layer 138 was completed, the application of the high frequency power and the introduction of the gases were terminated. The resultant was cooled, and was transferred into a conventional vacuum deposition apparatus, wherein on the previously formed p-type semiconductor layer 138 there was formed a 700 Å thick ITO film as the transparent electrode 139.

Thus, there was obtained a sample pin junction tandem type solar cell element.

The sample thus obtained was cut into a plurality of specimens 1 cm × 1 cm in size. On each of the specimens there was formed an aluminum thin film as the collecting electrode 140 by a conventional electron beam deposition process. Thus, there were obtained a plurality of solar cell samples.

These solar cell samples were examined in the same manner as in Example 1.

Of these solar cell samples, 10 solar cell samples which were substantially uniform in view of their examined characteristics were evaluated with respect to open circuit voltage (Voc), short circuit current per unit area (Joc), fill factor (F.F.), and photoelectric conversion efficiency ($\eta$) by a conventional method. The results obtained are as shown in Table 6. Each of the evaluated values shown in Table 6 is a mean value from the 10 solar cell samples.

In addition, Am-1.5 light of 100 mW/cm$^2$ intensity was irradiated through a filter (which blocks transmission of light of less than 600 nm in wavelength) to each of the solar cell samples, to thereby examine its long wavelength characteristics.

As a result, each of the solar cell samples was found to have excellent long wavelength characteristics. From these results, it was found that each of the solar cell samples exhibits an improved photoelectric conversion efficiency.

EXAMPLE 5

Figure 15:
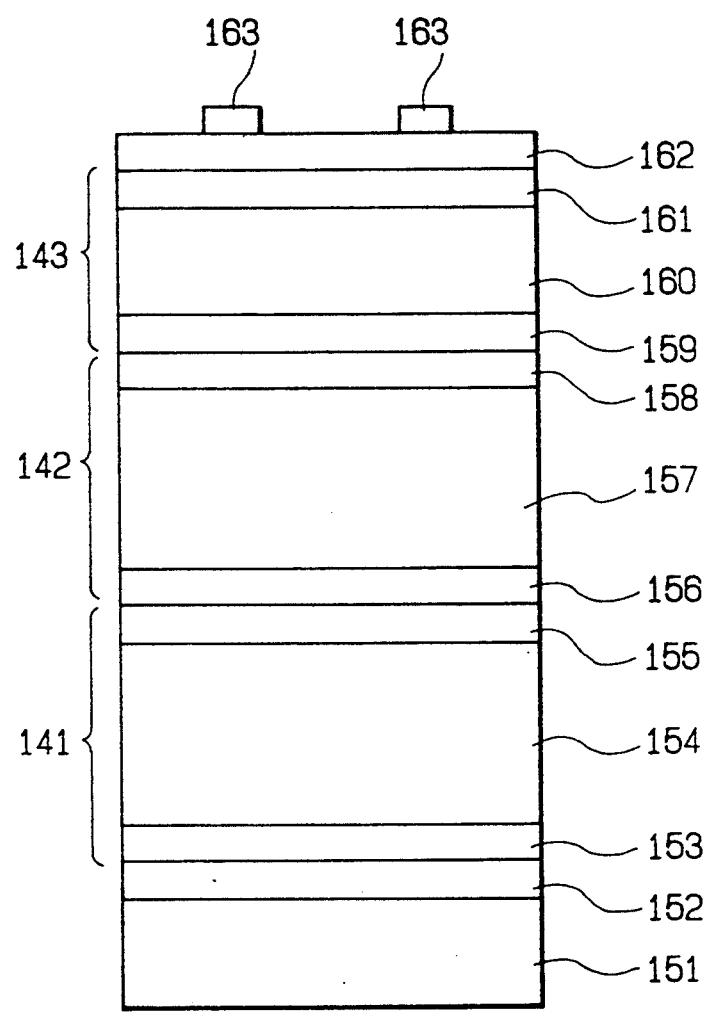
FIG. 15 is a schematic cross section view illustrating the constitution of the pin junction photovoltaic element obtained in Example 5 of the present invention which will be later described.

There was prepared a triple junction solar cell comprising three stacked pin junction solar cell units being stacked of the configuration shown in FIG. 15.

The pin triple junction type solar cell shown in FIG. 15 comprises a lower electrode 152, a first pin junction cell unit 141 (comprising a first n-type semiconductor layer 153, a first i-type semiconductor layer 154, and a first p-type semiconductor 155), a second pin junction solar cell unit 142 (comprising a second n-type semiconductor 156, a second i-type semiconductor layer 157, and a second p-type semiconductor layer 158), a third pin junction solar cell unit 143 (comprising a third n-type semiconductor layer 159, a third i-type semiconductor layer 160 and a third p-type semiconductor layer 161), and a transparent electrode 162, stacked in this order on a substrate 151. Reference numeral 163 indicates a collecting electrode disposed on the transparent electrode 162.

In this pin triple junction solar cell, the first i-type semiconductor layer 154 has a band gap graded in the thickness direction as in the i-type semiconductor layer of the pin junction solar cell obtained in Example 2, but each of the second and third i-type semiconductor layers 157 and 160 does not have such a graded band gap.

This pin triple junction solar cell was prepared in the following manner.

As the substrate 151, there was provided a SUS 304 stainless steel plate.

On the surface of this substrate 151 there were successively formed a 1000 Å thick Ag film and a 400 Å thick ZnO film as the lower electrode 152 by a conventional high frequency sputtering method.

The substrate having the lower electrode 152 formed thereon was placed on the surface of the substrate holder 204 of the film-forming apparatus shown in FIG. 7.

Then, by repeating the procedures of Example 1, on the lower electrode 152 there was formed the first n-type semiconductor layer 153. Then the procedures of Example 2 for forming the i-type semiconductor layer were repeated, except that the substrate temperate was changed to 320° C., to thereby form the first i-type semiconductor layer 154 comprising a-SiGe:H. Next, the procedures of Example 1 for forming the p-type semiconductor layer were repeated, except that the substrate temperature was changed to 300° C., to thereby form the first p-type semiconductor layer 155. Thus, there was formed the first pin junction solar cell unit 141 with a pin junction having a graded band gap similar to that in Example 2 shown in FIG. 11.

Then the procedures of Example 1 for forming the n-type semiconductor layer were repeated, except that the substrate temperate was changed to 280° C., to thereby form the second n-type semiconductor layer 156 comprising a-Si:H. Next, the procedures of Example 4 for forming the second i-type semiconductor layer were repeated, except that the substrate temperature was changed to 280° C. and film formation was performed for 75 minutes, to thereby form the second i-type semiconductor layer 157 comprising a 5000 Å thick a-Si:H film. The procedures of Example 1 for forming the p-type semiconductor layer were then repeated to thereby form the second p-type semiconductor layer 158. Thus, there was formed the second pin junction solar cell unit 142 with a pin junction not having a graded band gap.

Then the procedures of Example 1 for forming the n-type semiconductor layer were repeated, except that the substrate temperature was changed to 220° C., to thereby form the third n-type semiconductor layer 159 comprising a-Si:H. Then the procedures of Example 4 for forming the second i-type semiconductor layer were repeated, except that film formation was performed for 12 minutes, to thereby form the third i-type semiconductor layer 160 comprising a 800 Å thick a-Si:H film. The procedures of Example 4 for forming the second p-type semiconductor layer were then repeated to thereby form the third p-type semiconductor layer 161. Thus, there was formed the third pin junction solar cell unit 143 with a pin junction not having a graded band gap.

After the formation of the third p-type semiconductor layer 161 was completed, the application of the high frequency power and the introduction of the gases were terminated. The resultant was cooled, and was transferred into a conventional vacuum deposition apparatus, wherein on the previously formed p-type semiconductor layer 161 there was formed a 700 Å thick ITO film as the transparent electrode 162.

Thus, there was obtained a pin triple junction solar cell element sample.

The sample thus obtained was cut into a plurality of specimens 1 cm × 1 cm in size. On each of the specimens there was formed an aluminum thin film as the collecting electrode 163 by a conventional electron beam deposition process. Thus, there was obtained a plurality of solar cell samples.

These solar cell samples were examined in the same manner as in Example 1.

Of these solar cell samples, 10 samples which were substantially uniform in view of their examined characteristics were evaluated with respect to open circuit voltage (Voc), short circuit current per unit area (Joc), fill factor (F.F.), and photoelectric conversion efficiency ($\eta$) by a conventional method. The results obtained are shown in Table 6. Each of the evaluated values shown in Table 6 is a mean value from the 10 solar cell samples.

In addition, AM-1.5 light of 100 mW/cm² intensity was irradiated through a filter (which blocks transmission of light of less than 600 nm in wavelength) to each of the solar cell samples, to thereby examine its long wavelength characteristics.

As a result, each of the solar cell samples was found to have excellent long wavelength characteristics. From these results, it was found that any of the solar cell samples exhibits an improved photoelectric conversion efficiency.

FURTHER EVALUATION

From the solar cell samples obtained in each of Examples 1 and 2 and Comparative Example 1, a plurality of solar cell samples were randomly selected.

(1) For each of those solar cell samples, the photoelectric characteristics were determined by subjecting it to irradiation by a solar simulator with AM-1.5 light of 100 mW/cm² intensity, which has a spectrum similar to the sunlight spectrum in terms of AM value, in the same manner as in Example 1.

Figure 18:
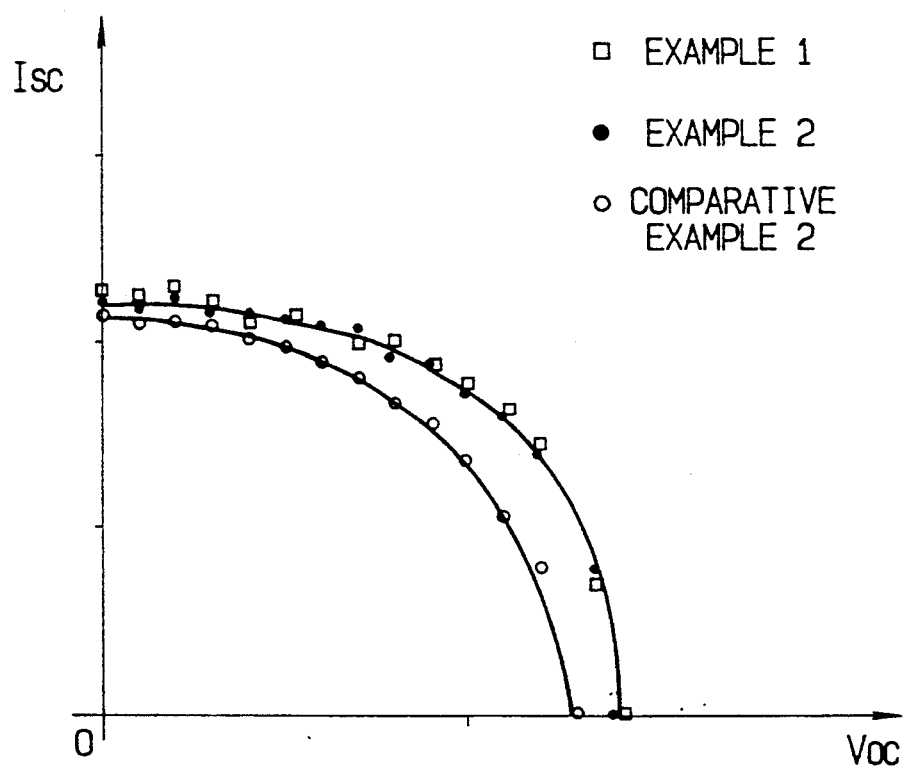
FIG. 18 shows graphs with respect to current/voltage characteristics of the specimens obtained in Examples 1 and 2 of the present invention and Comparative Example 2 which will be later described.

The results obtained are collectively shown in FIG. 18.

(2) AM-1.5 light of 100 mW/cm² intensity, was irradiated through a filter (which blocks transmission of light of less than 600 nm wavelength) to each of the solar cell samples, to thereby examine its long wavelength characteristics in the same manner as in Example 1.

Figure 19:
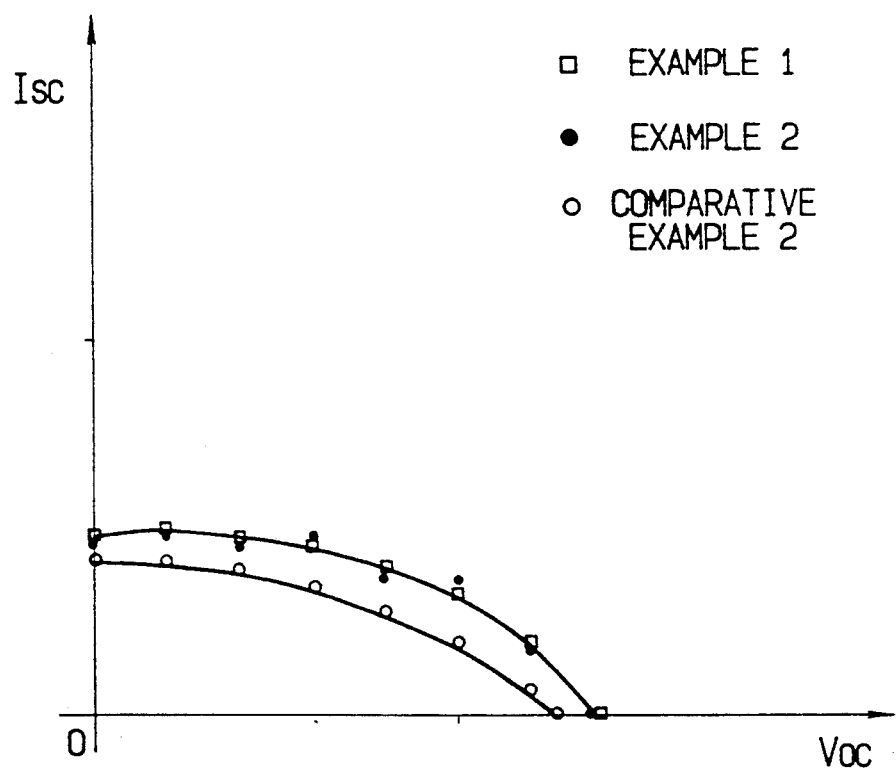
FIG. 19 shows graphs with respect to further current/voltage characteristics of the specimens obtained in Examples 1 and 2 of the present invention and Comparative Example 2 which will be later described.

The results obtained are collectively shown in FIG. 19.

From the results shown in FIGS. 18 and 19, it is understood that each of the solar cell samples obtained in Examples 1 and 2 of the present invention surpasses any of the solar cell samples obtained in accordance with the prior art in Comparative Example 2, particularly with respect to in the fill factor.

TABLE 1

| distance from the interface with the n-type semiconductor layer (Å) | optical band gap $Eg^{opt}$ (eV) | Ge content (atomic %) |
| --- | --- | --- |
| 0 | 1.70 | 0 |
| 750 | 1.50 | 32 |
| 1500 | 1.45 | 40 |
| 1750 | 1.70 | 0 |
| 2000 | 1.70 | 0 |

TABLE 2

| | open circuit voltage (v) | short circuit current Jsc (mA/cm²) | fill factor (F.F.) (%) | photoelectric conversion efficiency $\eta$ (%) |
| --- | --- | --- | --- | --- |
| Example 1 | 0.712 | 22.3 | 60.2 | 9.56 |
| Example 2 | 0.710 | 22.6 | 59.7 | 9.58 |
| Comparative Example 1 | 0.672 | 22.8 | 53.0 | 8.12 |
| Comparative Example 2 | 0.715 | 21.8 | 58.5 | 9.12 |

TABLE 3

| | open circuit voltage (v) | short circuit current Jsc (mA/cm²) | fill factor (F.F.) (%) | photoelectric conversion efficiency $\eta$ (%) |
| --- | --- | --- | --- | --- |
| Example 1 | 0.711 | 10.3 | 59.6 | 4.36 |
| Example 2 | 0.708 | 10.5 | 59.4 | 4.42 |
| Comparative Example 1 | 0.670 | 10.6 | 49.6 | 3.52 |
| Comparative Example 2 | 0.713 | 9.8 | 57.8 | 4.04 |

TABLE 4

| distance from the interface with the n-type semiconductor layer (Å) | optical band gap $Eg^{opt}$ (eV) | Ge content (atomic %) |
| --- | --- | --- |
| 0 | 2.0 | 0 |

TABLE 4-continued

| distance from the interface with the n-type semiconductor layer (Å) | optical band gap $Eg^{opt}$ (eV) | Ge content (atomic %) |
| --- | --- | --- |
| 250 | 1.75 | 0 |
| 1250 | 1.55 | 26 |
| 2850 | 1.48 | 38 |
| 3050 | 1.75 | 0 |
| 3250 | 1.75 | 0 |

TABLE 5

|  | open circuit voltage (v) | short circuit current Jsc (mA/cm²) | fill factor (F.F.) (%) | photoelectric conversion efficiency η (%) |
| --- | --- | --- | --- | --- |
| sunlight | 0.763 | 21.2 | 56.5 | 9.14 |
| long wavelength light | 0.760 | 9.7 | 56.2 | 4.14 |

TABLE 6

|  | open circuit voltage (v) | short circuit current Jsc (mA/cm²) | fill factor (F.F.) (%) | photoelectric conversion efficiency η (%) |
| --- | --- | --- | --- | --- |
| Example 4 | 1.650 | 11.28 | 70.4 | 13.1 |
| Example 5 | 2.540 | 7.69 | 70.2 | 13.7 |

What is claimed is:

1. A pin junction photovoltaic element having an i-type semiconductor layer formed of a variable band gap semiconductor material, said i-type semiconductor layer being positioned between a p-type semiconductor layer having a wider band gap than that of said i-type semiconductor layer and an n-type semiconductor layer having a wider band gap than that of said i-type semiconductor layer, characterized in that said i-type semiconductor layer contains a first region (a) which is positioned on the side of said p-type semiconductor layer and has a graded band gap, a second region (b) which is adjacent to said first region (a) and also has a graded band gap, and a third region (c) which is positioned on the side of said n-type semiconductor layer and also has a graded band gap; said i-type semiconductor layer having a minimum band gap at the boundary between said first region (a) and said second region (b); the thickness of said first region (a) being less than one-half of the total thickness of said i-type semiconductor layer; and the gradient of the band gap of said third region (c) being greater than that of said second region (b).

2. A pin junction photovoltaic element according to claim 1, wherein the second region (b) and the third region (c) are continuously formed such that their band gaps are continuously graded.

3. A pin junction photovoltaic element according to claim 1 which further comprises a fourth region (d) having a graded band gap between the second region (b) and the third region (c), wherein the gradient of the band gap of said fourth region (d) is greater than that of the second region (b) but smaller than that of the third region (c).

4. A pin junction photovoltaic element according to claim 1 which further comprises (i) an intermediate layer of 500 Å or less in thickness between the p-type semiconductor layer and the first region (a) of the i-type semiconductor layer, and (ii) another intermediate layer of 500 Å or less in thickness between the third region (c) of the i-type semiconductor layer and the n-type semiconductor layer.

5. A pin junction photovoltaic element according to claim 1 which is of the configuration in which light is impinged through the p-type semiconductor layer.

6. A pin junction photovoltaic element according to claim 1 which is of the configuration in which light is impinged through the n-type semiconductor layer.

7. A pin junction photovoltaic element according to claim 1, wherein the semiconductor material of which the i-type semiconductor layer is formed is a non-single crystalline semiconductor material.

8. A pin junction photovoltaic element according to claim 7, wherein the non-single crystalline material is an amorphous semiconductor material containing silicon atoms as a matrix.

* * * * *

UNITED STATES PATENT AND TRADEMARK OFFICE
CERTIFICATE OF CORRECTION

PATENT NO. : 5,252,142
DATED : October 12, 1993
INVENTOR(S) : JINSHO MATSUYAMA, ET AL.

It is certified that error appears in the above-indentified patent and that said Letters Patent is hereby corrected as shown below:

ON TITLE PAGE

In [56] References Cited, under OTHER PUBLICATIONS:

In "Solar Cells", "Amorphour" should read --Amorphous--.

In "Journal of Applied Physics", "p-in-n" should read --p-i-n--.

COLUMN 1

Line 67, "an" should be deleted.

COLUMN 3

Line 34, "n" should read --in--.

COLUMN 5

Line 34, "Further" should read --Further,--.

COLUMN 7

Line 38, "V;" should read --V,--.

COLUMN 8

Line 42, "may" should read --may be--.

UNITED STATES PATENT AND TRADEMARK OFFICE
CERTIFICATE OF CORRECTION

PATENT NO. : 5,252,142
DATED : October 12, 1993
INVENTOR(S) : JINSHO MATSUYAMA, ET AL.

It is certified that error appears in the above-indentified patent and that said Letters Patent is hereby corrected as shown below:

COLUMN 15

Line 65, "Then" should read --Then,--.

COLUMN 17

Line 23, "Semiconductor"," should read --Semiconductors",--.
Line 66, "GeH" should read --$GeH_4$--.

COLUMN 20

Line 32, "is" (second occurrence) should be deleted.

COLUMN 25

Line 1, "Then" should read --Then,--.
Line 7, "Then" should read --Then,--.
Line 21, "Then" should read --Then,--.

COLUMN 28

Line 15, "claim 1" should read --claim 1,--.
Line 22, "claim 1" should read --claim 1,--.
Line 30, "claim 1" should read --claim 1,--.

UNITED STATES PATENT AND TRADEMARK OFFICE
CERTIFICATE OF CORRECTION

PATENT NO. : 5,252,142
DATED : October 12, 1993
INVENTOR(S) : JINSHO MATSUYAMA, ET AL.

It is certified that error appears in the above-indentified patent and that said Letters Patent is hereby corrected as shown below:

COLUMN 28

Line 33, "claim 1" should read --claim 1,--.

Signed and Sealed this

Twenty-third Day of August, 1994

Attest:

BRUCE LEHMAN

Attesting Officer        Commissioner of Patents and Trademarks